United States Patent
Chen et al.

(10) Patent No.: US 10,177,032 B2
(45) Date of Patent: Jan. 8, 2019

(54) DEVICES, PACKAGING DEVICES, AND METHODS OF PACKAGING SEMICONDUCTOR DEVICES

(71) Applicant: Taiwan Semiconductor Manufacturing Company, Ltd., Hsin-Chu (TW)

(72) Inventors: Hsien-Wei Chen, Hsin-Chu (TW); An-Jhih Su, Bade (TW); Jo-Mei Wang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/675,375

(22) Filed: Mar. 31, 2015

(65) Prior Publication Data

US 2015/0371947 A1 Dec. 24, 2015

Related U.S. Application Data

(63) Continuation-in-part of application No. 14/308,369, filed on Jun. 18, 2014, now Pat. No. 9,831,214.

(51) Int. Cl.
*H01L 21/768* (2006.01)
*H01L 23/00* (2006.01)
(Continued)

(52) U.S. Cl.
CPC ...... *H01L 21/76898* (2013.01); *H01L 21/486* (2013.01); *H01L 23/3128* (2013.01);
(Continued)

(58) Field of Classification Search
CPC . H01L 2224/48227; H01L 2224/73265; H01L 2224/32145; H01L 2224/32225; H01L 2224/0401; H01L 2224/04105; H01L 2224/06515; H01L 2224/12105; H01L 2224/2518; H01L 2224/48091; H01L 2224/73267; H01L 2224/83005; H01L 2924/00012; H01L 2924/15311;
(Continued)

(56) References Cited

U.S. PATENT DOCUMENTS 5,763,955 A * 6/1998 Findley ............... G06F 17/5068
257/773
5,854,125 A * 12/1998 Harvey ............ H01L 21/31053
257/E21.244

(Continued)

OTHER PUBLICATIONS

Nakamura, T., "A Simple Approach to Litho-Litho-Etch Processing Utilizing Novel Positive Tone Photoresists," http://www.nikonprecision.com/ereview/spring_2010/article006.html, retrieved Jan. 30, 2015, 2 pages.

*Primary Examiner* — Sophia Nguyen
(74) *Attorney, Agent, or Firm* — Slater Matsil, LLP

(57) ABSTRACT

Devices, packaging devices, and methods of packaging semiconductor devices are disclosed. In some embodiments, a packaged semiconductor device includes a molding material and a plurality of through-vias disposed within the molding material. A dummy through-via and an integrated circuit die are also disposed within the molding material. An interconnect structure is disposed over the molding material, the plurality of through-vias, the dummy through-via, and the integrated circuit die.

21 Claims, 10 Drawing Sheets

(51) Int. Cl.
*H01L 23/31* (2006.01)
*H01L 25/10* (2006.01)
*H01L 21/48* (2006.01)
*H01L 23/538* (2006.01)
*H01L 25/065* (2006.01)
*H01L 23/498* (2006.01)

(52) U.S. Cl.
CPC .......... *H01L 23/5384* (2013.01); *H01L 24/06* (2013.01); *H01L 24/19* (2013.01); *H01L 24/25* (2013.01); *H01L 25/105* (2013.01); *H01L 23/49838* (2013.01); *H01L 23/5389* (2013.01); *H01L 25/0657* (2013.01); *H01L 2224/0401* (2013.01); *H01L 2224/04105* (2013.01); *H01L 2224/06515* (2013.01); *H01L 2224/12105* (2013.01); *H01L 2224/2518* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/92244* (2013.01); *H01L 2225/0651* (2013.01); *H01L 2225/06568* (2013.01); *H01L 2225/1035* (2013.01); *H01L 2225/1058* (2013.01); *H01L 2924/15311* (2013.01)

(58) Field of Classification Search
CPC ... H01L 2225/0651; H01L 2225/06568; H01L 2225/1035; H01L 2225/1058; H01L 23/3128; H01L 23/49827; H01L 24/06; H01L 24/19; H01L 24/25; H01L 25/0657; H01L 25/105; H01L 2224/73204; H01L 2224/1703; H01L 2224/17519; H01L 23/488; H01L 24/15; H01L 24/17; H01L 24/81; H01L 25/50; H01L 2924/18; H01L 21/486; H01L 21/76898; H01L 23/49838; H01L 23/5384; H01L 23/5389; H01L 2224/92244; H01L 2224/16235; H01L 23/34; H01L 23/4334; H01L 23/564; H01L 23/15; H01L 23/147; H01L 23/142; H01L 23/481; H01L 23/29; H01L 23/42; H01L 23/16; H01L 21/566; H01L 21/568; H01L 21/563; H01L 21/565; H01L 25/117; H01L 2224/83; H01L 2224/005; H01L 2224/92; H01L 2224/244; H01L 2224/9224

See application file for complete search history.

(56) References Cited

U.S. PATENT DOCUMENTS

| | | | | |
|---|---|---|---|---|
| 6,909,189 B2* | 6/2005 | Nanjo | ............... | H01L 21/76229 257/206 |
| 7,193,157 B2* | 3/2007 | Matsuda | ............ | H01L 23/4985 174/254 |
| 8,080,445 B1* | 12/2011 | Pagaila | ............. | H01L 23/49827 257/E21.499 |
| 8,269,350 B1* | 9/2012 | Chen | ................... | H01L 23/481 257/734 |
| 8,441,123 B1* | 5/2013 | Lee | ...................... | H01L 21/563 257/737 |
| 8,476,770 B2* | 7/2013 | Shao | ........................ | B29C 43/18 257/774 |
| 8,618,651 B1* | 12/2013 | Yee | ..................... | H01L 21/486 257/698 |
| 8,796,855 B2* | 8/2014 | Pelley | .................. | H01L 23/485 257/754 |
| 8,877,554 B2* | 11/2014 | Tsai | .................. | H01L 23/49816 257/737 |
| 9,035,461 B2* | 5/2015 | Hu | .......................... | H01L 24/19 257/696 |
| 9,087,832 B2* | 7/2015 | Huang | ............... | H01L 23/49827 |
| 9,263,394 B2* | 2/2016 | Uzoh | .................. | H01L 23/5384 |
| 9,355,962 B2 | 5/2016 | Lee et al. | | |
| 9,373,599 B2* | 6/2016 | Liu | ....................... | H01L 23/488 |
| 9,379,074 B2* | 6/2016 | Uzoh | ..................... | H01L 24/10 |
| 9,653,391 B1* | 5/2017 | Yew | ................... | H01L 23/49816 |
| 9,793,246 B1* | 10/2017 | Tseng | ................. | H01L 23/3128 |
| 9,847,269 B2* | 12/2017 | Lin | ........................ | H01L 23/3114 |
| 9,859,229 B2* | 1/2018 | Tsai | ....................... | H01L 23/60 |
| 9,870,997 B2* | 1/2018 | Chang | ................ | H01L 23/5389 |
| 9,881,908 B2* | 1/2018 | Lin | ....................... | H01L 25/105 |
| 2002/0079585 A1* | 6/2002 | Wong | ............... | H01L 21/76807 257/758 |
| 2002/0106837 A1* | 8/2002 | Cleeves | .................. | C04B 35/44 438/129 |
| 2004/0084761 A1* | 5/2004 | Karthikeyan | ......... | H01L 21/565 257/700 |
| 2004/0119134 A1* | 6/2004 | Goldberg | ............... | H01L 21/288 257/508 |
| 2005/0016859 A1* | 1/2005 | Huang | ................... | C25D 5/022 205/123 |
| 2005/0035457 A1* | 2/2005 | Tomita | .................. | H01L 23/522 257/758 |
| 2005/0196964 A1* | 9/2005 | Smith | ................. | G06F 17/5068 438/692 |
| 2006/0012052 A1* | 1/2006 | McDevitt | .......... | H01L 21/76802 257/778 |
| 2006/0118960 A1* | 6/2006 | Landis | .................. | H01L 23/522 257/758 |
| 2007/0018331 A1* | 1/2007 | Chen | .................. | H01L 23/562 257/774 |
| 2007/0246811 A1* | 10/2007 | Tsai | ...................... | H01L 25/105 257/678 |
| 2007/0275551 A1* | 11/2007 | Dunham | ............... | H01L 23/522 438/618 |
| 2008/0124933 A1* | 5/2008 | Ishikawa | ......... | H01L 21/823456 438/694 |
| 2008/0308950 A1* | 12/2008 | Yoo | ......................... | H01L 25/16 257/778 |
| 2009/0154128 A1* | 6/2009 | Tamadate | .............. | H01L 21/563 361/783 |
| 2009/0309212 A1* | 12/2009 | Shim | ...................... | H01L 21/568 257/700 |
| 2010/0133704 A1* | 6/2010 | Marimuthu | .......... | H01L 21/565 257/778 |
| 2010/0207262 A1 | 8/2010 | Park et al. | | |
| 2010/0237477 A1 | 9/2010 | Pagaila et al. | | |
| 2010/0261095 A1* | 10/2010 | Grant | ..................... | G03F 1/144 430/5 |
| 2010/0290191 A1* | 11/2010 | Lin | ................... | H01L 23/49816 361/704 |
| 2010/0301472 A1* | 12/2010 | Migita | ..................... | H01L 24/11 257/737 |
| 2011/0018114 A1 | 1/2011 | Pagaila et al. | | |
| 2011/0037169 A1* | 2/2011 | Pagaila | ................. | H01L 21/561 257/737 |
| 2011/0095436 A1* | 4/2011 | Chen | ................. | H01L 21/76898 257/774 |
| 2011/0115058 A1* | 5/2011 | Mieczkowski | ..... | H01L 21/6836 257/620 |
| 2011/0198747 A1* | 8/2011 | Kuo | ...................... | H01L 21/6836 257/737 |
| 2011/0215360 A1* | 9/2011 | Wang | .................... | H01L 33/62 257/99 |
| 2011/0215457 A1* | 9/2011 | Park | ..................... | H01L 23/3677 257/686 |
| 2011/0217841 A1* | 9/2011 | Chen | ................ | H01L 21/76898 438/667 |
| 2011/0260336 A1* | 10/2011 | Kang | ..................... | H01L 23/16 257/777 |
| 2011/0278732 A1 | 11/2011 | Yu et al. | | |

(56) References Cited

U.S. PATENT DOCUMENTS

| Publication No. | Date | Name | Classification | Subclass |
|---|---|---|---|---|
| 2011/0278736 A1* | 11/2011 | Lin | H01L 25/50 | 257/774 |
| 2012/0012985 A1* | 1/2012 | Shen | H01L 23/3171 | 257/618 |
| 2012/0075821 A1* | 3/2012 | Pagaila | H01L 23/3677 | 361/783 |
| 2012/0193789 A1* | 8/2012 | Hu | H01L 21/56 | 257/738 |
| 2012/0248629 A1* | 10/2012 | Knickerbocker | H01L 21/486 | 257/777 |
| 2012/0286418 A1* | 11/2012 | Lee | H01L 21/563 | 257/737 |
| 2012/0305916 A1 | 12/2012 | Liu et al. | | |
| 2013/0049182 A1* | 2/2013 | Gong | H01L 21/486 | 257/676 |
| 2013/0049217 A1* | 2/2013 | Gong | H01L 23/49822 | 257/774 |
| 2013/0049218 A1 | 2/2013 | Gong et al. | | |
| 2013/0087925 A1* | 4/2013 | Tsai | H01L 25/0657 | 257/774 |
| 2013/0105966 A1 | 5/2013 | Kelkar et al. | | |
| 2013/0105970 A1* | 5/2013 | Chi | H01L 21/4832 | 257/737 |
| 2013/0127048 A1* | 5/2013 | Hasegawa | H01L 23/3128 | 257/737 |
| 2013/0155636 A1* | 6/2013 | Park | H01L 23/5384 | 361/772 |
| 2013/0200509 A1* | 8/2013 | Kim | H01L 23/36 | 257/692 |
| 2013/0221519 A1* | 8/2013 | Hwang | H01L 23/49811 | 257/737 |
| 2013/0256876 A1* | 10/2013 | Lee | H01L 24/14 | 257/737 |
| 2013/0292830 A1* | 11/2013 | Liang | G06F 17/5068 | 257/738 |
| 2013/0292831 A1* | 11/2013 | Liu | H01L 23/488 | 257/738 |
| 2014/0027901 A1* | 1/2014 | Hu | H01L 21/6835 | 257/737 |
| 2014/0042643 A1 | 2/2014 | Yu et al. | | |
| 2014/0057394 A1* | 2/2014 | Ramasamy | H01L 25/50 | 438/113 |
| 2014/0061897 A1* | 3/2014 | Lin | H01L 24/06 | 257/737 |
| 2014/0103488 A1* | 4/2014 | Chen | H01L 24/83 | 257/532 |
| 2014/0103517 A1* | 4/2014 | Park | H01L 23/50 | 257/685 |
| 2014/0110836 A1* | 4/2014 | Tsai | H01L 24/94 | 257/737 |
| 2014/0110856 A1* | 4/2014 | Lin | H01L 24/19 | 257/774 |
| 2014/0124949 A1* | 5/2014 | Paek | H01L 25/105 | 257/774 |
| 2014/0160688 A1* | 6/2014 | Lu | H05K 1/181 | 361/728 |
| 2014/0252646 A1* | 9/2014 | Hung | H01L 23/481 | 257/774 |
| 2014/0262475 A1* | 9/2014 | Liu | H01L 25/50 | 174/377 |
| 2014/0264914 A1* | 9/2014 | Meyer | H01L 23/31 | 257/774 |
| 2014/0367160 A1* | 12/2014 | Yu | H01L 25/105 | 174/377 |
| 2015/0035161 A1 | 2/2015 | Miao et al. | | |
| 2015/0061095 A1* | 3/2015 | Choi | H01L 24/20 | 257/675 |
| 2015/0069606 A1* | 3/2015 | Liu | H01L 23/488 | 257/738 |
| 2015/0108635 A1* | 4/2015 | Liang | H01L 28/10 | 257/737 |
| 2015/0123268 A1* | 5/2015 | Yu | H01L 24/17 | 257/737 |
| 2015/0155218 A1 | 6/2015 | Hung et al. | | |
| 2015/0187722 A1* | 7/2015 | Chiang | H01L 23/5389 | 257/737 |
| 2015/0206815 A1* | 7/2015 | Katkar | H01L 21/561 | 257/738 |
| 2015/0262900 A1* | 9/2015 | Wang | H01L 23/04 | 257/704 |
| 2015/0262940 A1* | 9/2015 | Kitamura | H01L 23/53276 | 257/741 |
| 2015/0282367 A1 | 10/2015 | Barth et al. | | |
| 2015/0348916 A1* | 12/2015 | Chen | H01L 21/4803 | 257/669 |
| 2015/0357302 A1* | 12/2015 | Chen | H01L 24/19 | 257/773 |
| 2015/0371936 A1* | 12/2015 | Chen | H01L 23/49827 | 257/774 |
| 2015/0371947 A1* | 12/2015 | Chen | H01L 23/3128 | 257/774 |
| 2015/0380455 A1* | 12/2015 | Sugimoto | H01L 24/14 | 257/448 |
| 2016/0049363 A1* | 2/2016 | Cheng | H01L 23/28 | 257/774 |
| 2016/0064309 A1* | 3/2016 | Su | H01L 21/565 | 257/773 |
| 2016/0064342 A1* | 3/2016 | Chen | H01L 24/03 | 257/774 |
| 2016/0071779 A1* | 3/2016 | Chen | H01L 24/97 | 257/787 |
| 2016/0093572 A1* | 3/2016 | Chen | H01L 23/3128 | 257/774 |
| 2016/0126220 A1* | 5/2016 | Chen | H01L 21/563 | 257/737 |
| 2016/0133571 A1* | 5/2016 | Lee | H01L 21/56 | 257/774 |
| 2016/0133686 A1* | 5/2016 | Liao | H01L 23/5389 | 257/532 |
| 2016/0190057 A1* | 6/2016 | Zhao | H01L 23/3142 | 257/692 |
| 2016/0300773 A1* | 10/2016 | Lee | H01L 23/3121 | |
| 2018/0026010 A1* | 1/2018 | Huang | H01L 25/0657 | |

* cited by examiner

DEVICES, PACKAGING DEVICES, AND METHODS OF PACKAGING SEMICONDUCTOR DEVICES

PRIORITY CLAIM AND CROSS-REFERENCE

This application is a continuation-in-part of, and claims the benefit of, U.S. patent application Ser. No. 14/308,369, filed on Jun. 18, 2014 and entitled, "Semiconductor Device Packages, Packaging Methods, and Packaged Semiconductor Devices," which patent application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
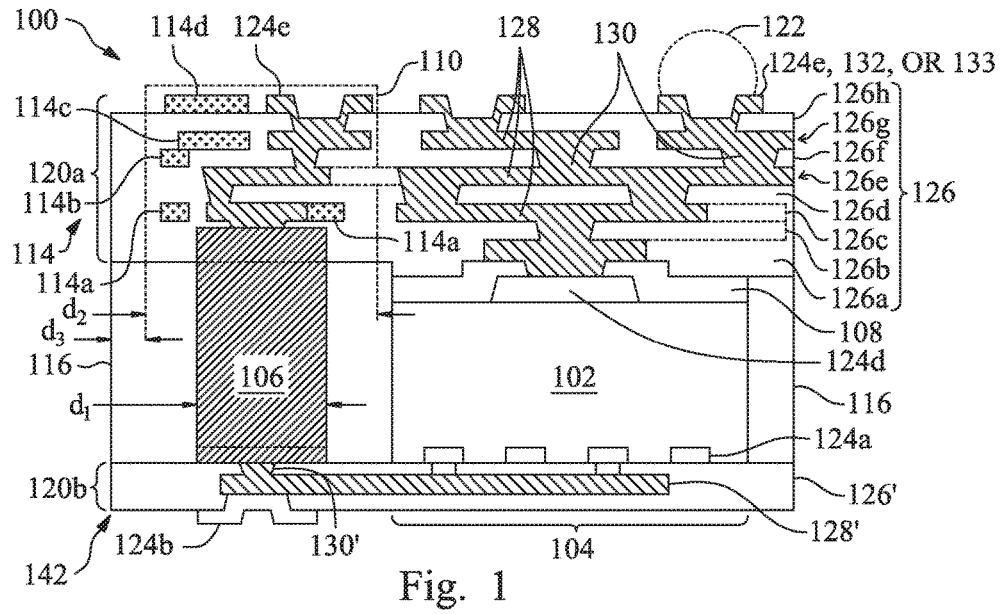
FIG. 1 is a cross-sectional view of a packaged semiconductor device in accordance with some embodiments of the present disclosure, wherein dummy features are formed in an interconnect structure of the package proximate a through-via region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure provide packages for semiconductor devices, methods of packaging semiconductor devices, and packaged semiconductor devices wherein dummy features are formed in an interconnect structure proximate through-vias of the package. The dummy features improve heat dissipation within the package.

Referring first to FIG. 1, a cross-sectional view of a portion of a packaged semiconductor device 100 in accordance with some embodiments of the present disclosure is shown. The packaged semiconductor device 100 includes dummy features 114 that are formed in a through-via region 110 of an interconnect structure 120a of the package. Dummy features 114a, 114b, 114c, and 114d are labelled collectively as dummy features 114 in FIG. 1.

For example, region 110 of the interconnect structure 120a comprises a through-via region 110. The through-via region 110 is disposed proximate a through-via 106 of the packaged semiconductor device. In the view shown in FIG. 1, the through-via region 110 is disposed over the through-via 106, for example. Alternatively, the through-via region 110 may be disposed under the through-via 106 in an interconnect structure, not shown. A portion of the through-via 106 may extend into the through-via region 110 in some embodiments, as shown. A portion of the through-via 106 may not extend into the through-via region 110 in other embodiments.

The dummy features 114 comprise a conductive material and are also referred to herein as dummy conductive features. The dummy features 114 are formed in the through-via region 110. Some conductive features of the interconnect structure 120a are also formed in the through-via region 110 in some embodiments. In other embodiments, some conductive features of the interconnect structure 120a are not formed in the through-via region 110.

The dummy features 114 are formed in one or more through-via regions 110 in some embodiments. The dummy features 114 are formed in through-via regions 110 having a low local density of conductive features of the interconnect structure 120a. For example, in embodiments wherein an initial design of the package comprises conductive features in a through-via region 110 of about 50% or less, dummy features 114 are included in the through-via region 110 to achieve a local density of dummy features 114 or a combination of dummy features 114 and conductive features of the interconnect structure 120a of about 50% or greater, in some embodiments.

The dummy features 114 are added in through-via region 110 above through-via 106 locations until the conductive feature and dummy feature 114 density of the interconnect structure 120a above the through-via 106 locations is greater than or equal to about 50% in some embodiments.

The packaged semiconductor device 100 includes an integrated circuit die 102 that is packaged in a package that includes a plurality of the through-vias 106 and a material 116 disposed around and between the plurality of through-vias 106 the integrated circuit die 102. Only one through-via 106 is shown in FIG. 1; however, the packaged semiconductor device 100 may include dozens, hundreds, or thousands of through-vias 106 formed therein. The material 116 comprises an insulating material in some embodiments. The material 116 comprises a molding material or an underfill material in some of the embodiments shown in FIG. 1, for example. In other embodiments, the material 116 comprises an interposer substrate material, to be described further herein.

The integrated circuit die 102 is disposed in an integrated circuit mounting region 104 of the package. The integrated circuit mounting region 104 is disposed within the material 116 in the embodiments shown in FIG. 1. Alternatively, the integrated circuit mounting region 104 may be disposed in other locations of the package, to be described further herein.

In some embodiments, a package for a semiconductor device includes the interconnect structure 120a that includes the dummy features 114. The interconnect structure 120a is disposed over the plurality of through-vias 106, the integrated circuit die mounting region 104, and the material 116. The interconnect structure 120a comprises a redistribution layer (RDL) or a post-passivation interconnect (PPI) structure in some embodiments. The interconnect structure 120a may alternatively comprise other types of wiring structures. The interconnect structure 120a comprises a plurality of conductive feature layers disposed proximate one of the plurality of through-vias, and the interconnect structure comprises a plurality of dummy features 114 in some embodiments. One or more of the plurality of dummy features 114 is disposed in one or more of the plurality of conductive feature layers of the interconnect structure 120a in some embodiments, to be described further herein.

The interconnect structure 120a comprises a first interconnect structure 120a in some embodiments. A second interconnect structure 120b is formed on an opposite side of the package. The first interconnect structure 120a comprises a front side RDL, and the second interconnect structure 120b comprises a back side RDL, in some embodiments.

The integrated circuit die 102 includes a plurality of contact pads 124a formed on a surface thereof in some embodiments. The second interconnect structure 120b include a plurality of contact pads 124b formed on a surface thereof in some embodiments. The through-vias 106 may also include a contact pad 124c formed on one end. In other embodiments, the through-vias 106 do not include contact pads 124c formed on one end. The integrated circuit die 102 includes a plurality of contact pads 124d formed on an opposite surface from the surface that the contact pads 124a are formed on, in some embodiments. A passivation material 108 is disposed over the integrated circuit die 102 and portions of the contact pads 124d in some embodiments. Portions of the interconnect structure 120a are coupled to the contact pads 124d of the integrated circuit die 102 through openings in the passivation material 108 in some embodiments. In other embodiments, the passivation material 108 is not included. Portions of the interconnect structure 120a are coupled to the through-vias 106 in some embodiments.

The interconnect structure 120a includes a plurality of insulating material layers 126a, 126b, 126c, 126d, 126e, 126f, 126g, and 126h in some embodiments. The insulating material layers 126a, 126b, 126c, 126d, 126e, 126f, 126g, and 126h are collectively labelled as insulating material layers 126 in FIG. 1. The insulating material layers 126a, 126b, 126c, 126d, 126e, 126f, 126g, and 126h comprise a polymer or other insulating materials. A plurality of conductive lines 128 is disposed within insulating material layers 126a, 126c, 126e, and 126g. A plurality of conductive vias 130 is disposed within insulating material layers 126b, 126d, and 126f. Contact pads 124e, an under-ball metallization (UBM) structure, and/or conductive traces 133 are formed over insulating material layer 126h. The contact pads 124e, UBM structure 132, and/or conductive traces 133 may be covered with additional insulating material layer with or without open vias for connectors 122 in some embodiments. The contact pads 124e, UBM structure 132, and/or conductive traces 133 are coupled to the conductive lines 128 and/or vias 130. The conductive features of the interconnect structure 120a comprising the conductive lines 128, vias 130, contact pads 124e, UBM structure 132, and/or conductive traces 133 may comprise a conductive material such as Cu, Al, W, other metals, or alloys, combinations, or multiple layers thereof, as examples. The conductive features of the interconnect structure 120a comprising the conductive lines 128, vias 130, contact pads 124e, UBM structure 132, and/or conductive traces 133 are each formed in a conductive feature layer of the packaged semiconductor device 100. Alternatively, the interconnect structure 120a may comprise other types of conductive features and may be comprised of other materials.

Connectors 122 (shown in phantom, e.g., in dashed lines in FIG. 1) are coupled to the contact pads 124e, UBM structure 132, or conductive traces 133 in some embodiments. A plurality of the connectors 122 are coupled to the interconnect structure 120a in some embodiments, for example. In other embodiments, the connectors 122 are not included in the packaged semiconductor device 100. The connectors 122 comprise a eutectic or lead free material and may comprise connectors formed in a ball grid array (BGA) arrangement in some embodiments, for example.

The second interconnect structure 120b also includes insulating material layers 126', conductive lines 128', vias 130', and contact pads 124b, and may also include UBM structures (not shown) and/or conductive traces (also not shown) as described for the first interconnect structure 120a. The second interconnect structure 120b is disposed beneath the plurality of through-vias 106, the integrated circuit die 102 in the integrated circuit die mounting region 104, and the material 116. In some embodiments, the through-via 106 is coupled to a contact pad 124b by a via 130' and conductive line 128' of the second interconnect structure 120b.

The second interconnect structure 120b shown in FIG. 1 includes one conductive line 128' layer and one via 130' layer. Alternatively, the second interconnect structure 120b may comprise two or more conductive line 128' layers and two or more via 130' layers. Likewise, the first interconnect structure 120a may include one or more conductive line 128 layers and one or more via 130 layers, in some embodiments.

The dummy features 114 advantageously provide improved thermal dissipation for the package. For example, openings for portions of contact pads 124b in insulating material layers 126' of the second interconnect structure 120b may be formed in some embodiments using a thermal process, such as a laser. Heat may also be generated in the package when a solder-on-pad (SOP) process is used for forming connectors on contact pads of the interconnect structures, for example. The presence of the dummy features 114 provides thermal dissipation during the thermal patterning process for the insulating material layers 126', for connector formation, and other processes, as examples.

The dummy features 114 are advantageously formed in the same material layers that conductive features of the packaged semiconductor device 100 are formed in. For example, dummy features 114a are formed in the same conductive feature layer that conductive lines 128 are formed in insulating material layer 126c, and dummy features 114b are formed in the same conductive feature layer that vias 130 are formed in insulating material layer 126f in FIG. 1. Similarly, dummy features 114c are formed in the same conductive feature layer that conductive lines 128 are formed in insulating material layer 126g, and dummy features 114d are formed in the same conductive feature layer that contact pads 124e are formed in insulating material layer 126h. Likewise, dummy features 114 may also be formed in the same conductive feature layers that conductive lines 128 are formed in insulating material layers 126a and 126e, and dummy features 114 may also be formed in the same conductive feature layers that vias 130 are formed in insulating material layers 126b and 126d, not shown, as examples. Thus, no additional processing steps are required to include the dummy features 114 in the package. Existing lithography masks and packaging processes for the conductive features of the interconnect structure 120a may advantageously be modified to include the dummy features 114 in the packaged semiconductor device 100.

The conductive feature layer of the interconnect structure 120a that the dummy features 114 may be formed in may comprise one or more conductive line layers, via layers, contact pad layers, conductive trace layers, or UBM layers in some embodiments, for example. Alternatively, the dummy features 114 may be formed in other types of material layers of the interconnect structure 120a proximate the through-via region 110.

Because the dummy features 114 are formed in the same material layer that conductive features in a conductive feature layer of the interconnect structure 120a are formed in, the dummy features 114 comprise the same material as the conductive features in the conductive feature layer of the interconnect structure 120a in some embodiments.

The through-vias 106 comprise a width or diameter comprising dimension $d_1$, wherein dimension $d_1$ comprises about 80 μm to about 300 μm in some embodiments. Dimension $d_1$ is also referred to herein as a first width. The through-via region 110 of the interconnect structure 120a comprises a width comprising dimension $d_2$. Dimension $d_2$ is also referred to herein as a second width. Dimension $d_2$ comprises about $(1.5*d_1)$ in some embodiments, for example. Dimension $d_2$ is substantially equal to or about equal to $(1.5*d_1)$ in some embodiments. In other embodiments, dimension $d_2$ may comprise about $(1*d_1)$ to about $(2*d_1)$, as other examples. Alternatively, dimensions $d_1$ and $d_2$ may comprise other dimensions and other relative dimensions. The second width of the through-via region 110 is at least the same width or larger than the first width of the through-via 106, in order to provide sufficient heat dissipation for thermally conductive properties of the through-via 106 and other portions of the packaged semiconductor device 100 in some embodiments, for example.

Figure 2:
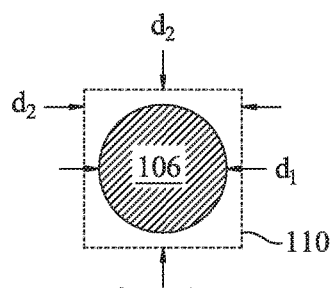
FIG. 2 is a top view illustrating a through-via region of a packaged semiconductor device in accordance with some embodiments.

The through-vias 106 comprise a substantially circular shape in a top view of the packaged semiconductor device 100 in some embodiments, as shown in FIG. 2. Alternatively, the through-vias 106 may comprise other shapes, such as oval, square, rectangular, or other shapes in the top view. The through-via region 110 comprises a substantially square shape in the top view, also shown in FIG. 2. The through-via region 110 may alternatively comprise other shapes, such as rectangular, circular, oval, or other shapes in the top view. In some embodiments, the through-via region 110 comprises a square shape that is substantially concentric with a through-via 106, for example.

Referring again to FIG. 1, the through-via region 110 is spaced apart from an edge 142 of the packaged semiconductor device 100 by an amount comprising dimension $d_3$.

Dimension $d_3$ comprises about 20 µm or greater in some embodiments, for example. Alternatively, dimension $d_3$ may comprise other values.

Figure 3:
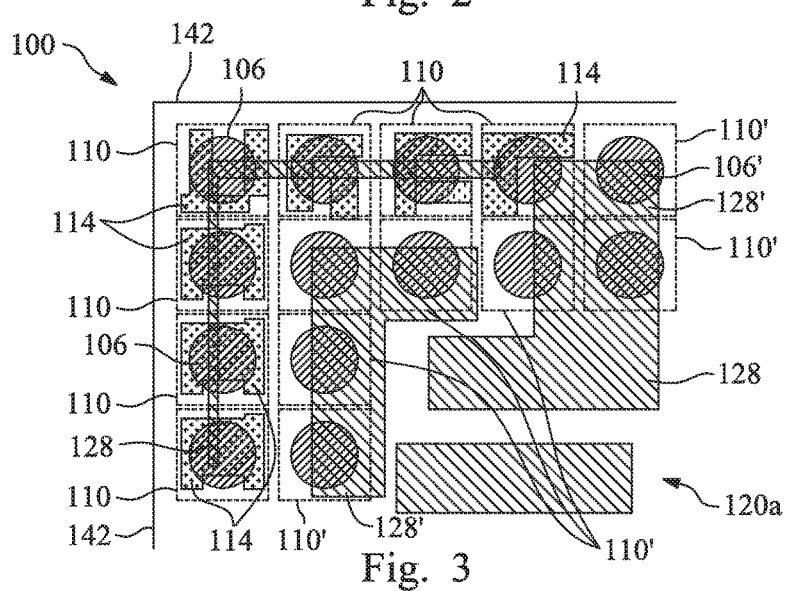
FIG. 3 is a top view of a portion of a packaged semiconductor device that illustrates dummy features formed in through-via regions in accordance with some embodiments.

FIG. 3 is a top view of a portion of a packaged semiconductor device 100 that illustrates dummy features 114 formed in through-via regions 110 of an interconnect structure 120a in accordance with some embodiments. A corner portion of the packaged semiconductor device 100 is shown. Dummy features 114 are included proximate through-via regions 110. Dummy features 114 are including within the through-via region 110 that are disposed within the interconnect structure 120a proximate the through-vias 106, for example. Dummy features 114 are not included proximate through-via regions 110'.

Portions of the dummy features 114 are formed directly over the through-vias 106. Other portions of the dummy features 114 are not formed directly over the through-vias 106, but are formed directly over material 116 (see FIG. 1) proximate and adjacent the through-vias 106.

In order to determine which through-via regions 110 or 110' to include the dummy features 114 in the design, an analysis of the local density (e.g., within each through-via region 110 or 110' proximate a through-via 106 or 106') of conductive lines 128 and 128' in an original design for conductive feature layer or layers is performed. If the local density of conductive lines 128 is less than 50%, as is the case in through-via regions 110 in FIG. 3 (which can be seen in the top view of FIG. 3), the dummy lines 114 are included in the interconnect region 120a in the through-via region 110. An adequate size and/or number of dummy lines 114 is included in each of the through-via regions 110 to achieve a local density of about 50% or greater of either: a) dummy lines 114; or b) both the dummy lines 114 and conductive lines 128, in accordance with some embodiments.

For example, in some embodiments, a plurality of dummy conductive features 114 is included in the packaged semiconductor device 100, and the interconnect structure comprises a plurality of conductive features (i.e., conductive lines 128, vias 130, contact pads 124e, UBM structures 132, and/or conductive traces 133). Forming the plurality of dummy conductive features 114 and forming the plurality of conductive features 128, 130, 124e, 132, and/or 133 comprises forming one or more of the plurality of dummy conductive features 114 and one or more of the plurality of conductive features 128, 130, 124e, 132, and/or 133 such that each of the through-via regions 110 comprises a density of about 50% or greater of the one or more of the plurality of dummy conductive features 114, or about 50% or greater of the one or more of the plurality of dummy conductive features 114 and the one or more of the plurality of conductive features 128, 130, 124e, 132, and/or 133 in some embodiments.

In through-via regions 110', the local density of the conductive lines 128' is greater than 50%, and dummy lines 114 are not required or included in the through-via regions 110', for example. Conductive lines 128' are larger in the top view than conductive lines 128 in FIG. 3. Alternatively, a greater number of conductive lines 128' may be disposed in through-via regions 110' (not shown), which would create a local density of the conductive lines 128' of greater than 50%, and which would also not require dummy lines 114 to be included in the through-via regions 110', as another example, in accordance with some embodiments of the present disclosure.

The arrangement and locations of the through-via regions 110 and 110' illustrated in FIG. 3 is merely an example. Alternatively, the through-via regions 110 that include dummy features 114 may be located in other regions of a packaged semiconductor device 100, and may be arranged in other patterns and shapes.

The dummy features 114 are spaced apart along their length by a predetermined distance from conductive features formed in the same conductive feature layer in some embodiments. The dummy features 114 may be spaced apart from conductive features formed in the same conductive feature layer by about a width of a dummy feature or greater, as an example. The dummy features 114 may comprise substantially the same width as conductive features formed in the same conductive feature layer, or the dummy features 114 may comprise a different width as conductive features formed in the same conductive feature layer. Alternatively, the dummy features 114 may comprise other spacing dimensions and relative width dimensions with respect to conductive features formed in the same conductive feature layer.

Figure 4:
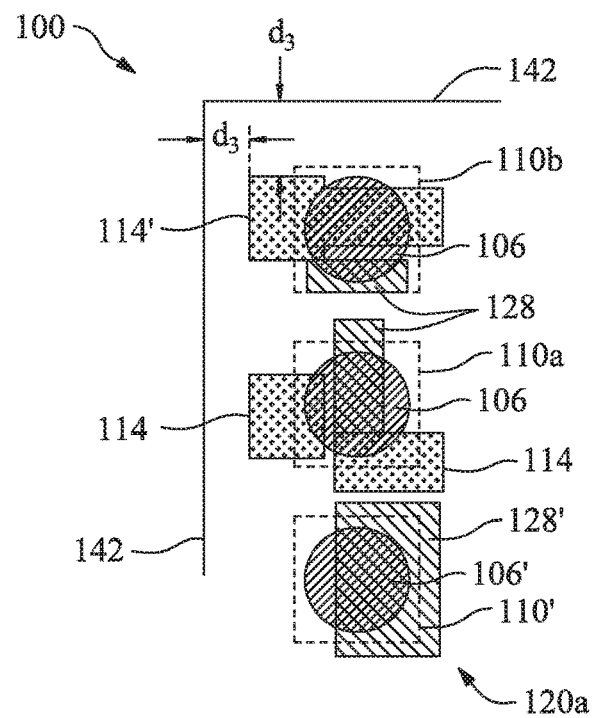
FIG. 4 is a top view of a portion of a packaged semiconductor device that illustrates some exemplary shapes and arrangements of dummy features formed in through-via regions in accordance with some embodiments.

FIG. 4 is a top view of a portion of a packaged semiconductor device 100 that illustrates some exemplary shapes and arrangements of dummy features 114 formed in through-via regions 110 of an interconnect structure 120a in accordance with some embodiments. In through-via region 110', the conductive line 128' fills over 50% of the through-via region 110' (e.g., has a local density of over 50%), and dummy features 114 are thus not included in through-via region 110'. In through-via region 110a, the conductive line 128 fills less than 50% of the through-via region 110a, and thus, dummy features 114 are included in the through-via region 110a. Two dummy features 114 are included in through-via region 110a in the example shown. Alternatively, one dummy feature 114, or three or more dummy features 114 may be included in a through-via region 110 or 110a. The dummy features 114 comprise substantially square or rectangular shapes in the top view. Alternatively, the dummy features 114 may comprise other shapes. The two dummy features 114 comprise two isolated dummy features 114 formed in a conductive feature layer of the interconnect structure 120a that do not intersect in through-via region 110a. The dummy features 114 may be formed in two different conductive feature layers of the interconnect structure 120a, as another example.

In through-via region 110b, the conductive line 128 fills less than 50% of the through-via region 110b, and thus, a dummy feature 114' is included in the through-via region 110a. The dummy feature 114' may comprise two dummy features that intersect in some embodiments. The dummy feature 114' comprises a shape of a letter T. The dummy feature 114' may alternatively comprise other shapes, such as L-shaped, meandering patterns, or irregular shapes, or combinations of square, rectangular and/or other shapes in the top view. Alternatively, the dummy feature 114' may comprise other shapes. Combinations of one or more dummy features 114 and 114' may also be included in a single through-via region 110, 110a, or 110b of an interconnect structure 120a.

Figure 5:
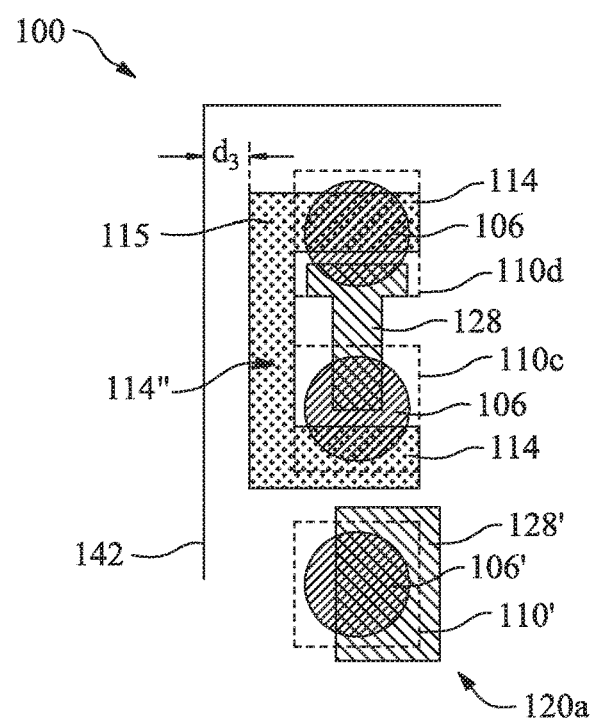
FIG. 5 is a top view of a portion of a packaged semiconductor device that illustrates dummy features formed in through-via regions in accordance with some embodiments, wherein dummy features in adjacent through-via regions are coupled together.

FIG. 5 is a top view of a portion of a packaged semiconductor device 100 that illustrates a dummy feature 114" formed in through-via regions 110c and 110d in accordance with some embodiments, wherein dummy features 114 of adjacent through-via regions 110c and 110d are coupled together. The dummy features 114 are coupled together by a segment 115 of conductive material, forming a dummy feature 114" that extends between and into the through-via regions 110c and 110d.

The dummy features 114, 114', and 114" are not coupled to a conductive line 128 or other conductive feature of the interconnect structure 120a in some embodiments. In other embodiments, at least one dummy feature 114, 114', or 114" may be coupled to a conductive line 128 or other conductive feature of the interconnect structure 120a (see the right-most dummy feature 114a in FIG. 1). The dummy features 114, 114', or 114" may be formed in the same conductive feature layer that conductive lines 128 are formed in. The dummy features 114, 114', or 114" may be formed in a different conductive feature layer that conductive lines 128 are formed in. The dummy features 114, 114', or 114" may be formed in the same conductive feature layer that conductive lines 128 are formed in and also one or more different conductive feature layers that conductive lines 128 are formed in, as another example.

FIGS. 4 and 5 also illustrate that the dummy features 114, 114', and 114" can extend to an exterior of the through-via regions 110 in some embodiments. In some embodiments, the dummy features 114, 114', and 114" do not change electrical connection properties within each conductive feature layer, for example. The dummy features 114 are not coupled to dummy features 114 in neighboring (e.g., adjacent or proximate) through-via regions 110, 110a, or 110b in some embodiments, as shown in FIG. 4. The dummy features 114 are not connected in neighboring through-via regions 110, 110a, or 110b in embodiments wherein conductive features in the original conductive feature layer design were not connected together, for example. In other embodiments, the dummy features 114 can connect to dummy features 114 in neighboring through-via regions 110, as shown in FIG. 5 at 114". The dummy features 114 can be connected in neighboring through-via regions 110, 110c, and 110d (e.g., by a conductive segment 115) in embodiments wherein conductive features in the original conductive feature layer design were connected together, for example.

Referring again to FIGS. 1, 3, 4, and 5, in accordance with some embodiments of the present disclosure, a packaged semiconductor device 100 includes a molding material 116, a plurality of through-vias 106 disposed within the molding material 116, and an integrated circuit die 102 disposed within the molding material 116. An interconnect structure 120a is disposed over the molding material 116, the plurality of through-vias 106, and the integrated circuit die 102. The interconnect structure 120a includes a conductive feature layer (e.g., including a conductive feature 128, 130, 124e, 132, or 133) and a through-via region 110 proximate one of the plurality of through-vias 106. The through-via region 110 of the interconnect structure 120a includes a dummy conductive feature 114 disposed in the conductive feature layer. In some embodiments, the through-via region 110 comprises a first through-via region, and the dummy conductive feature 114 comprises a first dummy conductive feature. The one of the plurality of through-vias 106 comprises a first one of the plurality of through-vias. The interconnect structure 120a includes a second through-via region proximate a second one of the plurality of through-vias 106, and the second through-via region includes a second dummy conductive feature formed therein (see FIGS. 4 and 5). The second dummy conductive feature is coupled to the first dummy conductive feature in some embodiments (FIG. 5), or the second dummy conductive feature is not coupled to the first dummy conductive feature in other embodiments (FIG. 4). In some embodiments, the second dummy conductive feature is formed in the conductive feature layer (FIG. 1). In other embodiments, the conductive feature layer comprises a first conductive feature layer, and the interconnect structure 120a comprises a second conductive feature layer. The second dummy conductive feature is formed in the second conductive feature layer (FIG. 1). In some embodiments, the second through-via region is disposed adjacent or proximate the first through-via region (FIGS. 4 and 5).

Figure 6:
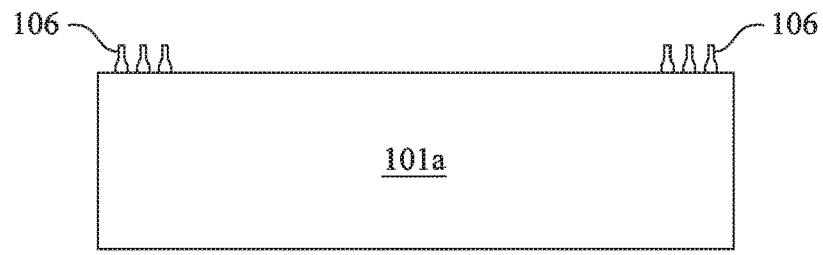
FIGS. 6 through 11 are cross-sectional views illustrating a method of packaging a semiconductor device at various stages of a packaging process in accordance with some embodiments.

FIGS. 6 through 11 are cross-sectional views illustrating a method of packaging a semiconductor device at various stages in accordance with some embodiments of the present disclosure. In FIG. 6, a carrier 101a is provided. The carrier 101a comprises a first carrier 101a in some embodiments. The carrier 101a may comprise glass, silicon oxide, aluminum oxide, or a semiconductor wafer, as examples. The carrier 101a may also comprise other materials.

A plurality of conductive elements 106 (may also be referred to as through-vias 106 as they will extend through subsequently formed material 116, see, e.g., FIG. 8) is formed over the first carrier 101a. The through-vias 106 may be formed using subtractive techniques, damascene techniques, plating, or other methods. For example, in a subtractive technique, a conductive material such as Cu, a Cu alloy, other metals, or combinations or multiple layers thereof may be formed over an entire surface of the first carrier 101a, and the conductive material is patterned to form the through-vias 106. The conductive material may be patterned using photolithography, by forming a layer of photoresist over the conductive material, exposing the layer of photoresist to light or energy reflected from or transmitted through a lithography mask having a desired pattern thereon, and developing the layer of photoresist. Exposed (or unexposed, depending on whether the layer of photoresist is positive or negative) portions of the layer of photoresist are then ashed and removed. The patterned layer of photoresist is then used as an etch mask during an etch process for the conductive material. The layer of photoresist is then removed, leaving the conductive material patterned with the desired pattern of the through-vias 106.

As another example, the through-vias 106 may be formed using a plating process. A seed layer (not shown) is formed over the first carrier 101a, and a sacrificial layer such as an insulating material or photoresist is formed over the seed layer. The sacrificial layer is then patterned using photolithography with the desired pattern of the through-vias 106, and a plating process is used to plate a conductive material such as Cu, a Cu alloy, or other metals over the seed layer. The sacrificial layer is then removed.

Figure 7:
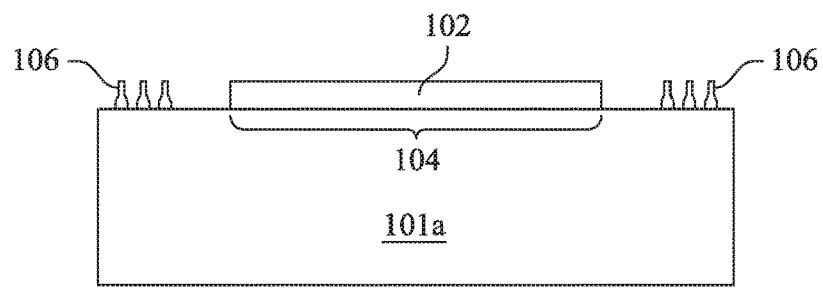

Referring next to FIG. 7, an integrated circuit die 102 is provided. The integrated circuit die 102 may be previously fabricated on a semiconductor wafer and singulated along scribe lines to form individual integrated circuit dies 102, for example. The integrated circuit die 102 may comprise a logic chip, a memory chip, a processor, an application specific device, or a chip having other functions, as examples. Only one integrated circuit die 102 is shown in the drawings; however, a plurality of integrated circuit dies 102 may be packaged over the carrier 101a simultaneously, and the packaged devices are later singulated to form individually packaged dies 102 or a plurality of dies 102 packaged together in a single package.

The integrated circuit die 102 is coupled to the first carrier 101a manually or using an automated machine such as a pick-and-place machine, as shown in FIG. 7. The integrated circuit die 102 is coupled to the first carrier 101a in the integrated circuit die mounting region 104 using an adhesive or a die attach film (DAF) (not shown in FIG. 104; see DAF 135 shown in FIG. 18). In some embodiments, one integrated circuit die 102 is coupled to the first carrier 101a and is packaged using the techniques described herein. In other embodiments, two or more integrated circuit dies 102 may be coupled to the first carrier 101a and packaged together in a single packaged semiconductor device 100 (not shown in the drawings). A plurality of integrated circuit dies 102 comprising the same or different functions may be packaged together in accordance with some embodiments, for example. One or more types of integrated circuit dies 102 may be packaged in a single packaged semiconductor device 100 to form a system on a chip (SoC) device in some embodiments, for example.

The packaging step shown in FIG. 7 may be performed before the packaging step shown in FIG. 6 in some embodiments. For example, the integrated circuit die 102 may first be coupled to the first carrier 101a, and the through-vias 106 may then be formed over the first carrier 101a.

Figure 8:
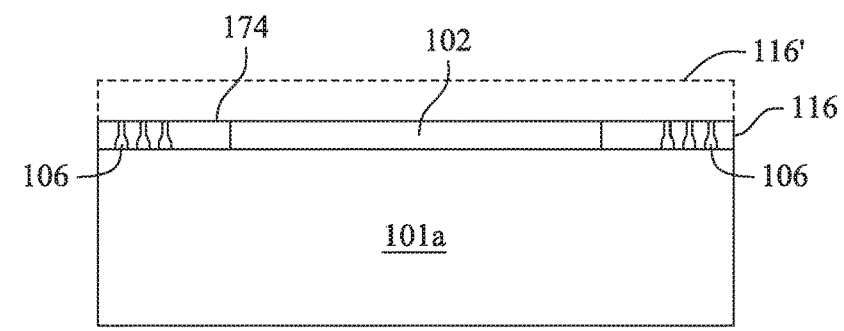

Material 116 is formed over the first carrier 101a over the through-vias 106 and the integrated circuit die 102, as shown in FIG. 8. As applied, the material 116 may extend over a top surface of the die 102 and the through-vias 106 in some embodiments, as shown in phantom at 116'. The material 116 comprises an underfill material or molding material in the embodiments shown in FIG. 8. The material 116 is formed around the integrated circuit die 102, around the plurality of through-vias 106, and between the through-vias 106 and integrated circuit die 102. The material 116 may be molded using compressive molding, transfer molding, or other methods. The material 116 encapsulates the integrated circuit dies 102 and the through-vias 106, for example. The material 116 may comprise an epoxy, an organic polymer, or a polymer with or without a silica-based or glass filler added, as examples. In some embodiments, the material 116 comprises a liquid molding compound (LMC) that is a gel type liquid when applied. Alternatively, the material 116 may comprise other insulating and/or encapsulating materials, or other materials.

In some embodiments, the material 116 is applied so that it extends to top surfaces of the integrated circuit dies 102. The top surface of the material 116 is substantially coplanar with top surfaces of the integrated circuit dies 102 and the through-vias 106 in some embodiments, for example, as shown in FIG. 8.

If the material 116 extends over top surfaces of the integrated circuit dies 102 and the through-vias 106 after the material 116 is applied, as shown in FIG. 8 at 116', the material 116 is removed from over the top surfaces of the integrated circuit dies 102 and the through-vias 106 using a chemical-mechanical polish (CMP) process, an etch process, other methods, or combinations thereof, in some embodiments, for example, as shown in FIG. 8. The material 116 is left remaining between and around the integrated circuit dies 102 and the through-vias 106.

Next, the material 116 is cured using a curing process in some embodiments. The curing process may comprise heating the material 116 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the material 116 may be cured using other methods. In some embodiments, a curing process is not required for the material 116.

Figure 9:
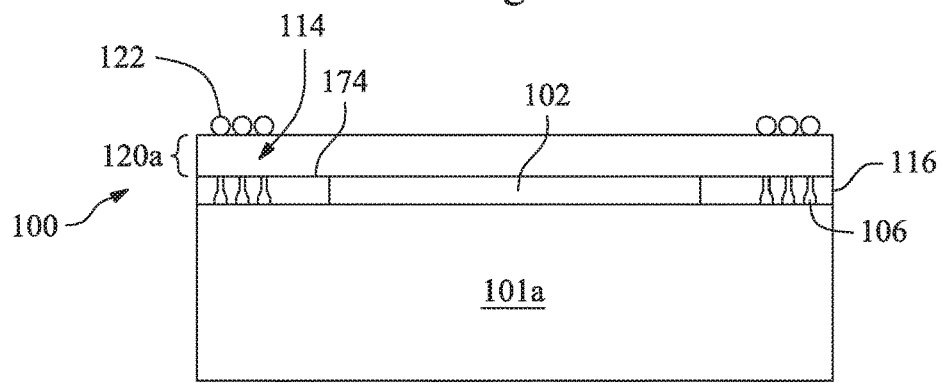

An interconnect structure 120a including one or more dummy features 114 described herein is formed over a first side 174 of the integrated circuit die 102, the plurality of through-vias 106, and the material 116 in some embodiments, as shown in FIG. 9. (The details of the dummy features 114 are not shown in FIG. 9 through 13; refer to FIG. 1 and FIGS. 3 through 5). The first side 174 comprises a front side of the packaged semiconductor device 100 in some embodiments, for example. The interconnect structure 120a comprises one or more insulating material layers and conductive features formed in the insulating material layers (not shown in FIG. 9; see insulating material layers 126a, 126b, 126c, 126d, 126e, 126f, 126g, and 126h comprising a polymer and conductive features comprising conductive lines 128, vias 130, contact pads 124e, UBM structures 132, and conductive traces 133 comprising Cu, Al, W, other metals, or combinations or multiple layers thereof shown in FIG. 1). The interconnect structure 120a may be formed using one or more subtractive etch processes or damascene processes, for example. The interconnect structure 120a comprises a first interconnect structure 120a in some embodiments.

A dummy conductive feature 114 is formed in the through-via region 110 (see FIG. 1) of the interconnect structure 120a in a conductive feature layer of the interconnect structure 120a in some embodiments. The dummy conductive feature 114 is formed simultaneously with the formation of the conductive feature layer of the interconnect structure 120a that the dummy conductive feature 114 is formed in, in some embodiments, for example.

In some embodiments, after the interconnect structure 120a is formed, the carrier 101a is removed, and the packaging process for the packaged semiconductor device 100 is complete. A plurality of the packaged semiconductor devices 100 are then singulated using a saw blade or laser along scribe lines.

In other embodiments, a plurality of connectors 122 is formed on the interconnect structure 120a, also shown in FIG. 9. The connectors 122 are formed on contact pads or UBM structures of the interconnect structure 120a, for example (see FIG. 1). The connectors 122 comprise a eutectic material such as solder, and may comprise solder balls or solder paste in some embodiments. The connectors 122 may include other types of electrical connectors, such as microbumps, controlled collapse chip connection (C4) bumps, or pillars, and may include conductive materials such as Cu, Sn, Ag, Pb, or the like.

In some embodiments, after the connectors 122 are formed, the carrier 101a is removed, and the packaging process for the packaged semiconductor device 100 is complete. A plurality of the packaged semiconductor devices 100 are then singulated using a saw blade or laser along scribe lines.

Figure 10:
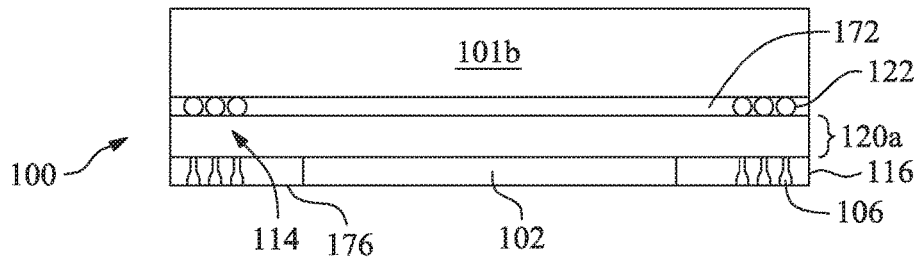

In other embodiments, a second carrier 101b is coupled to the connectors 122 and to the interconnect structure 120a, as shown in FIG. 10. The second carrier 101b may be coupled to the connectors 122 and/or to the interconnect structure 120a using a temporary adhesive 172, for example. The first carrier 101a is then removed, also shown in FIG. 10.

Figure 11:
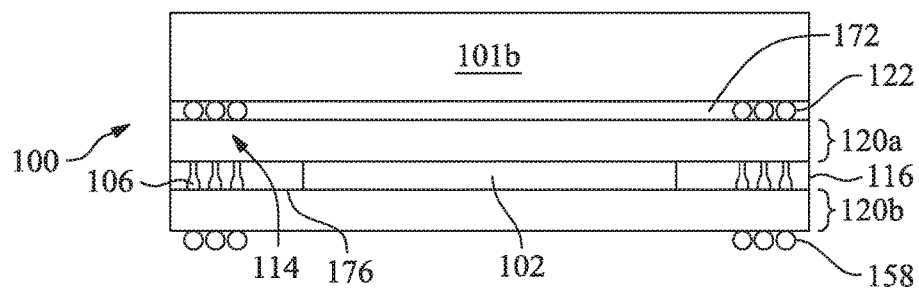

In some embodiments, a second interconnect structure 120b is then formed on a second side 176 of the integrated circuit die 102, the through-vias 106, and the material 116, as shown in FIG. 11. The second side 176 is opposite the first side 174. The second side 176 comprises a back side of the packaged semiconductor device 100 in some embodiments, for example. The second interconnect structure 120b comprises similar materials and features as described for the first interconnect structure 120a, for example.

A plurality of connectors 158 is coupled to the second side 176 of the packaged semiconductor device 100 in some embodiments, also shown in FIG. 11. The connectors 158 are coupled to portions of the second interconnect structure 120b in some embodiments, such as contact pads (not shown), for example. The connectors 158 comprise similar materials and formation methods as described for connectors 122 in some embodiments, for example. The second carrier 101b and adhesive 172 are then removed or debonded from a plurality of the packaged semiconductor devices 100, and the packaged semiconductor devices 100 are then singulated using a saw blade or laser along scribe lines.

The packaged semiconductor devices 100 may then be electrically and mechanically coupled to another packaged semiconductor device, to a printed circuit board (PCB), or in an end application or to another object using the connectors 122 and/or 158.

Figure 12:
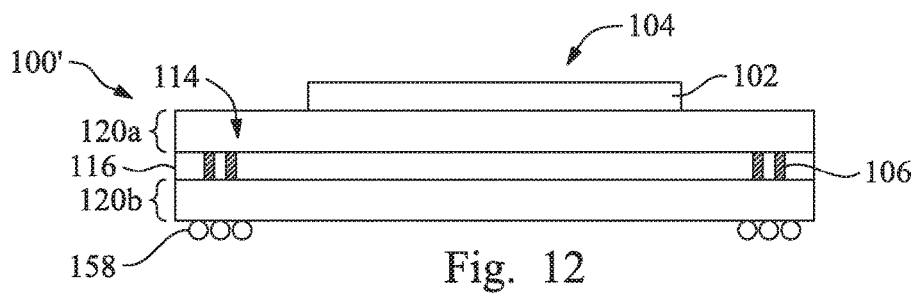
FIG. 12 is a cross-sectional view of a packaged semiconductor device that includes dummy features formed in a through-via region of an interconnect structure of the package in accordance with some embodiments.

FIG. 12 is a cross-sectional view of a packaged semiconductor device 100' that includes at least one dummy feature 114 formed in a through-via region 110 of an interconnect structure 120a of the package in accordance with some embodiments. The through-vias 106 comprise through-interposer vias (TIVs) in the embodiments shown, for example. Material 116 comprises an interposer substrate material in some of the embodiments shown in FIG. 12. The material 116 comprises a package substrate in some embodiments, for example. The material 116 comprises a substrate comprising a semiconductor material, glass fiber, resin, a filler, other materials, and/or combinations thereof, in some embodiments, for example. The material 116 may comprise a glass substrate or a polymer substrate, as other examples. The material 116 may comprise a substrate that includes one or more passive components (not shown) embedded inside.

The integrated circuit mounting region 104 is disposed over the interconnect structure 120a in some of the embodiments shown in FIG. 12. An integrated circuit die 102 is coupled over an interconnect structure 120a of the packaged semiconductor device 100' in the embodiments shown, for example. The integrated circuit mounting region 104 is disposed proximate a surface of an interconnect structure 120a or 120b in some embodiments, for example. The integrated circuit die 102 is coupled to an integrated circuit mounting region 104 on an interconnect structure 120a that is disposed over material layer 116, for example. Alternatively, an integrated circuit die 102 may be coupled to material 116, not shown.

Figure 13:
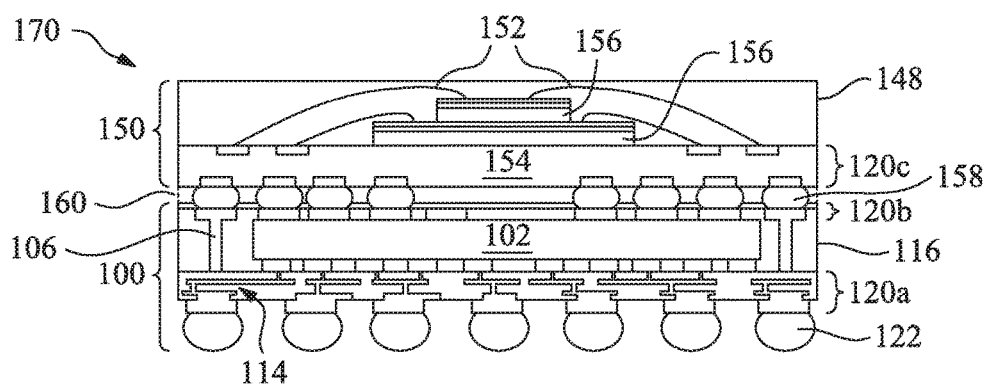
FIG. 13 is a cross-sectional view of a packaged semiconductor device in accordance with some embodiments, wherein a first packaged semiconductor device is coupled to a second packaged semiconductor device.

FIG. 13 is a cross-sectional view of a packaged semiconductor device 170 in accordance with some embodiments, wherein a packaged semiconductor device 100 described herein is coupled to another packaged semiconductor device 150. The packaged semiconductor device 100 comprises a first packaged semiconductor device 100 in some embodiments, and the first packaged semiconductor device 100 is coupled to a second packaged semiconductor device 150 by a plurality of connectors 158. The connectors 158 which may comprise solder balls or other materials are coupled between contact pads of the first packaged semiconductor device 100 and contact pads of the second packaged semiconductor device 150, for example. Some contact pads are coupled to the integrated circuit die 102 and some of the contact pads are coupled to the through-vias 106, in some embodiments. In some embodiments, the packaged semiconductor device 170 comprises a package-on-package (PoP) device, for example.

The packaged semiconductor device 100 includes a plurality of the through-vias 106 formed within the material 116. The through-vias 106 provide vertical connections for the packaged semiconductor device 100. The interconnect structures 120a and 120b provide horizontal electrical connections for the packaged semiconductor device 100. Packaged semiconductor device 150 also includes an interconnect structure 120c that provides horizontal electrical connections for the packaged semiconductor device 150. Interconnect structure 120c is coupled to interconnect structure 120b by a plurality of connectors 158.

The second packaged semiconductor device 150 includes one or more integrated circuit dies 156 coupled to a substrate 154. In some embodiments, the dies 156 comprise memory chips. For example, the dies 156 may comprise dynamic random access memory (DRAM) devices in some embodiments. Alternatively, the dies 156 may comprise other types of chips. Wire bonds 152 may be coupled to contact pads on a top surface of the integrated circuit die or dies 156, which are coupled to bond pads on the substrate 154. The wire bonds 152 provide vertical electrical connections for the packaged semiconductor device 150 in some embodiments, for example. A molding material 148 may be disposed over the wire bonds 152, the integrated circuit die or dies 156, and the substrate 154.

Alternatively, a PoP device 170 may include two packaged semiconductor devices 100 described herein that are coupled together in some embodiments, not shown in the drawings. In some embodiments, the PoP device 170 may comprise a system-on-a-chip (SOC) device, as another example.

In some embodiments, an insulating material 160 is disposed between the packaged semiconductor devices 100 and 150 between the connectors 158, as shown in phantom in FIG. 13. The insulating material 160 may comprise an underfill material or a molding material, as examples. Alternatively, the insulating material 160 may comprise other materials, or the insulating material 160 may not be included.

In the embodiments illustrated in FIGS. 1 through 13, dummy conductive features 114 are included in a package for a semiconductor device proximate through-via regions 110 of an interconnect structure 120a of the package. In other embodiments of the present disclosure, dummy through-vias 182 are included in a package for a semiconductor device, to be described herein with reference to FIGS. 14 through 23.

Figure 14:
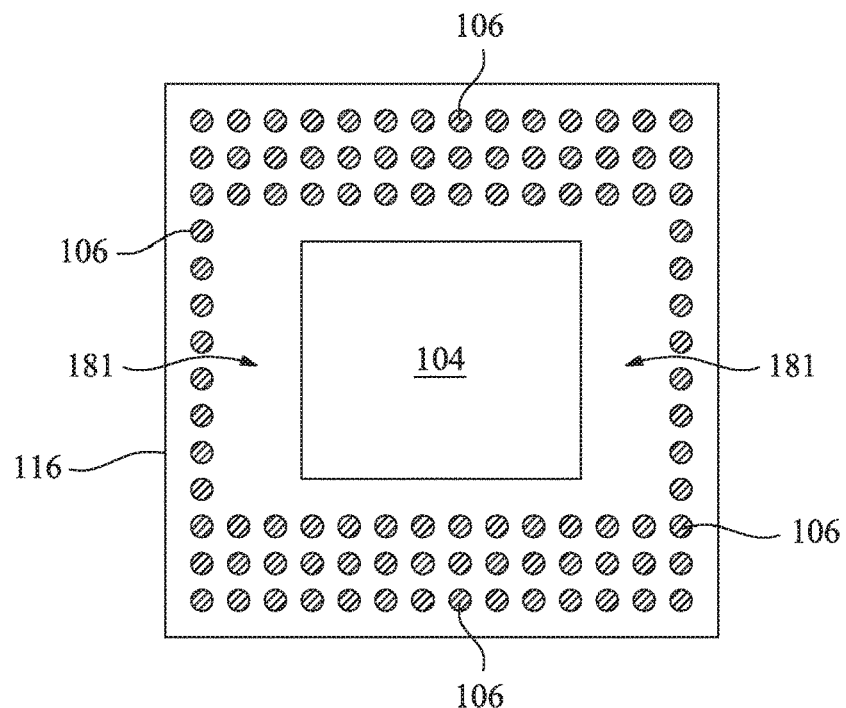
FIGS. 14 through 17 are top views that illustrate packaging devices for semiconductor devices in accordance with some embodiments, wherein dummy through-vias are included in the packaging devices.

FIGS. 14 through 17 illustrate top views of packaging devices for semiconductor devices in accordance with some embodiments. FIG. 14 shows a top view of a packaging device at an initial stage of a design process. The initial design includes a plurality of through-vias 106 disposed within a material 116 of the packaging device. The initial design includes regions 181 that are not within the integrated circuit mounting region 104 and that do not include through-vias 106. Through-vias 106 at the right edge and left edge proximate regions 181 comprise isolated through-vias 106, e.g., versus densely patterned through-vias 106 in the top three rows and the bottom three rows of the packaging device shown in FIG. 14.

Figure 21A:
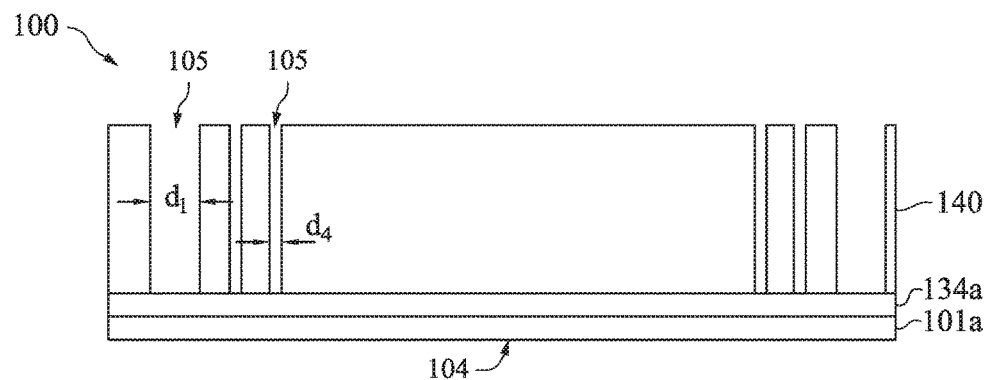
FIGS. 21A, 21B, and 22 are cross-sectional views illustrating a method of packaging a semiconductor device in accordance with some embodiments wherein the dummy through-vias are smaller than the electrically functional through-vias.
Figure 21B:
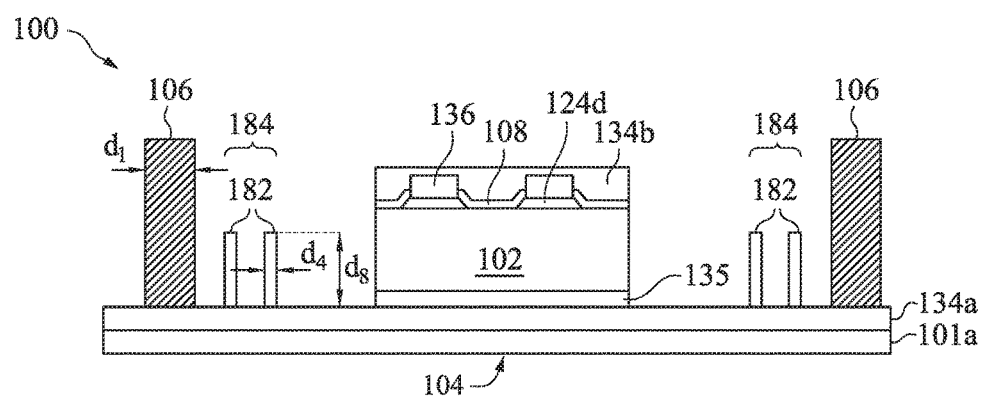
Figure 22:
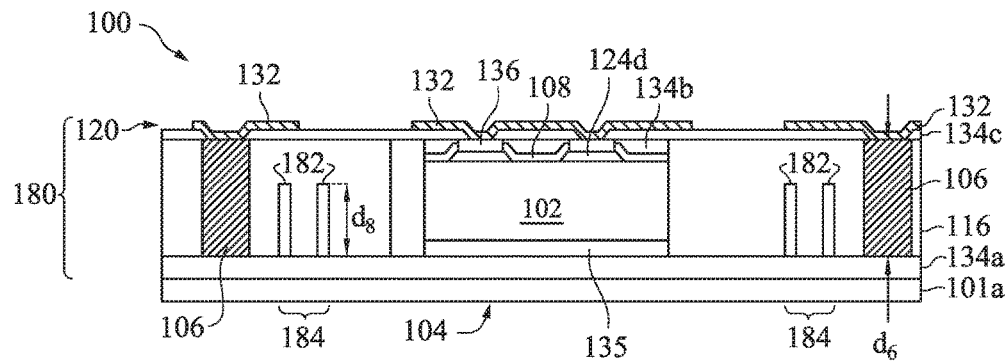

In accordance with some embodiments of the present disclosure, dummy through-vias 182 (may also be referred to as dummy conductive elements 182 as material 116 is not yet formed, and also in some embodiments they do not extend through material 116, see, e.g., FIGS. 21-22) are included in a package design, wherein the dummy through-vias 182 are formed in a dummy through-via region 184 that is proximate the plurality of through-vias 106 that are electrically functional, as shown in FIGS. 15, 16, 17, and 20, which will be described further herein. The dummy through-vias 182 may be formed in regions 181 shown in FIG. 14 that are outside the integrated circuit mounting region 104 that do not include any of the plurality of through-vias 106, for example. The dummy through-vias 182 may be formed in isolated regions of the pattern of the plurality of through-vias 106 in some embodiments, as another example. The dummy through-vias 182 may also be formed in other areas of a packaging device. The dummy through-vias 182 improve uniformity of embedded through-vias 106 of the package, by preventing disconnections or over-grinding of planarization processes used to remove the material 116 from top surfaces of the through-vias 106 and integrated circuit dies 102 (see FIGS. 8 and 19), as examples. Thus, initial package designs such as the one shown in FIG. 14 may be modified to include the dummy through-vias 182 to be described herein.

Figure 15:
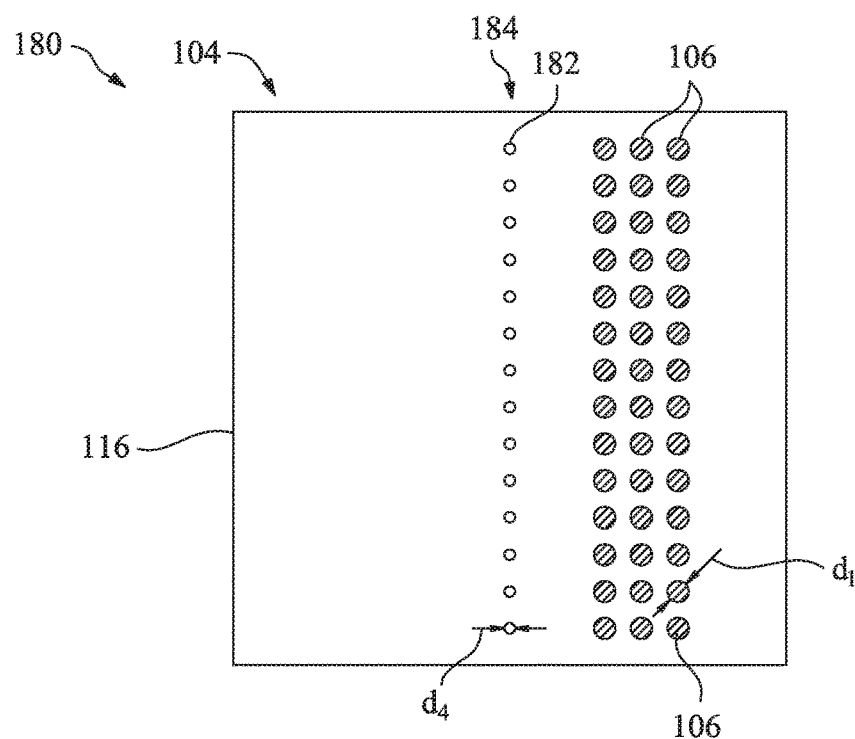

FIG. 15 is a top view of a portion of a packaging device 180 in accordance with some embodiments. The plurality of dummy through-vias 182 is arranged in a dummy through-via region 184 in a substantially straight line in the embodiments shown. The dummy through-vias 182 comprise a width or diameter in some embodiments comprising dimension $d_4$, wherein dimension $d_4$ comprises about 30 µm to about 80 µm, or about 40 µm to about 70 µm, in some embodiments. Dimension $d_4$ may also comprise other values. Dimension $d_4$ is less than the width or diameter of the electrically functional through-vias 106 comprising dimension $d_1$ in some embodiments, for example. Dimension $d_4$ is also referred to herein as a second width in some embodiments.

The plurality of dummy through-vias 182 is disposed between at least one of the plurality of through vias 106 and the integrated circuit die region 104 in some embodiments, which is also illustrated in FIG. 15. Including the dummy through-vias 182 in the packaging device 180 may result in a partially populated array of through-vias 106 and dummy through-vias 182 in the embodiments shown in FIG. 15, for example. In other embodiments, including the dummy through-vias 182 in the packaging device 180 results in a fully populated array of through-vias 106 and dummy through-vias 182, as shown in FIG. 16.

In FIG. 15, one column of a plurality of dummy through-vias 182 is illustrated in the dummy through-via region 184. Two or more rows or columns of a plurality of dummy through-vias 182 may also be included in dummy through-via regions 184 of a packaging device 180 proximate some of the plurality of through-vias 106.

Figure 16:
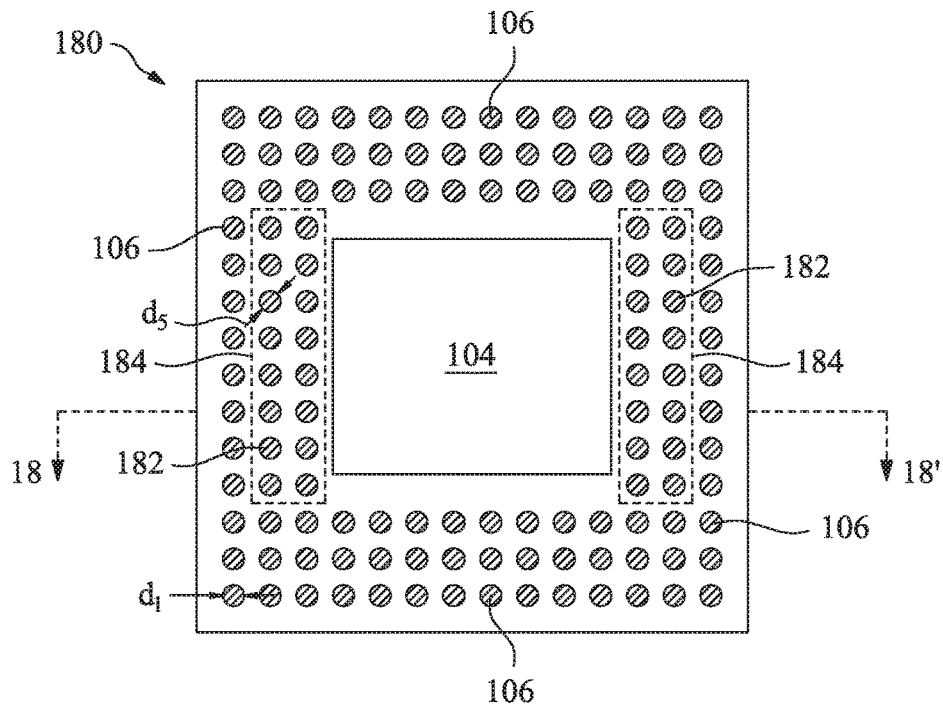
Figure 17:
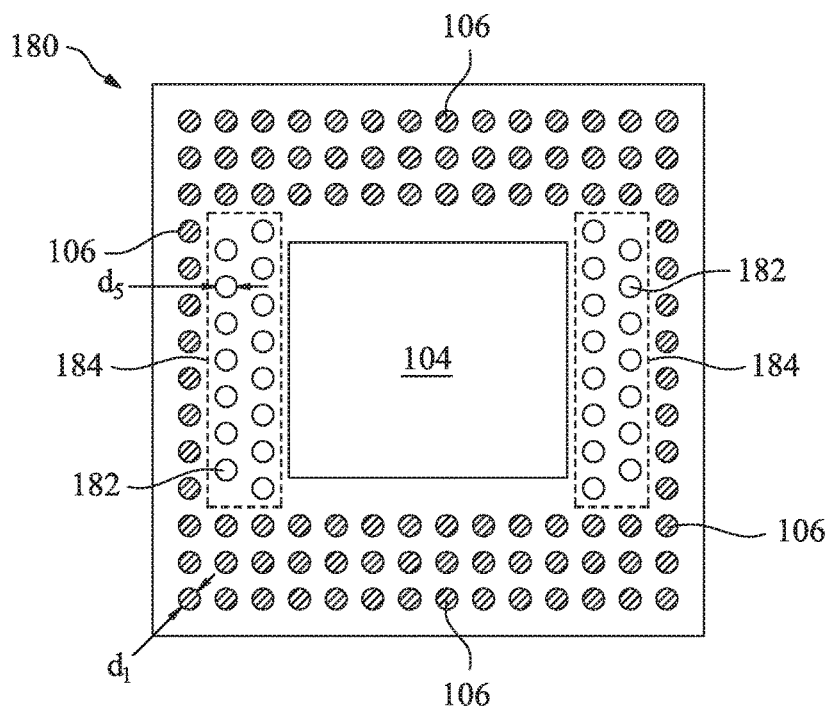
Figure 18:
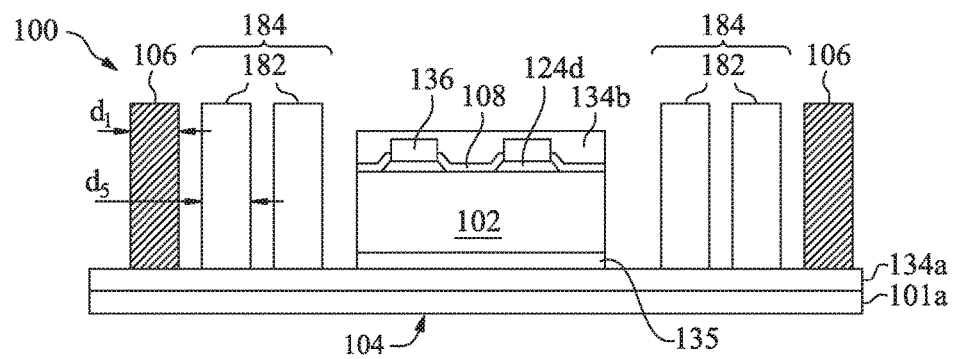
FIGS. 18 and 19 are cross-sectional views illustrating a method of packaging a semiconductor device in accordance with some embodiments, wherein dummy through-vias are substantially the same size as electrically functional through-vias of the packaging devices.

FIG. 16 illustrates a top view of a packaging device 180 in accordance with some embodiments, wherein the dummy through-vias 182 comprise substantially the same size as the electrically functional through-vias 106. A cross-sectional view at 18-18' of a portion of the packaging device 180 shown in FIG. 16 is shown in FIG. 18, with an integrated circuit die 102 being coupled to the integrated circuit die mounting region 104. The dummy through-vias 182 may comprise a same shape or a different shape than the through-vias 106. The dummy through-vias 182 are formed in dummy through-via regions 184 proximate isolated through-vias 106. The through-vias 106 comprise a width or diameter in some embodiments comprising dimension $d_1$, wherein dimension $d_1$ comprises about 80 µm to about 310 µm, or about 140 µm to about 300 µm, in some embodiments. Dimension $d_1$ may also comprise other values. The width or diameter of the through-vias 106 comprising dimension $d_1$ is also referred to herein as a first width. The dummy through-vias 182 comprise a width or diameter in some embodiments comprising dimension $d_5$, wherein dimension $d_5$ is substantially the same as the first width. The width or diameter of the dummy through-vias 182 comprising dimension $d_5$ is also referred to herein as a second width, wherein the second width is substantially the same as the first width in some embodiments, for example.

In the embodiments shown in FIG. 16, the plurality of dummy through-vias 182 is arranged in two substantially straight lines proximate isolated through-vias 106, between the through-vias 106 and the integrated circuit die mounting region 104. The plurality of dummy through-vias 182 is included in the dummy through-via regions 184 and is arranged in a shape of an array of substantially straight rows and columns in some embodiments. In other embodiments, the plurality of dummy through-vias 182 is included in the dummy through-via regions 184 and is arranged in a shape of an array of staggered rows and columns, or one or more staggered lines, as illustrated in the embodiments shown in FIG. 17.

Figure 19:
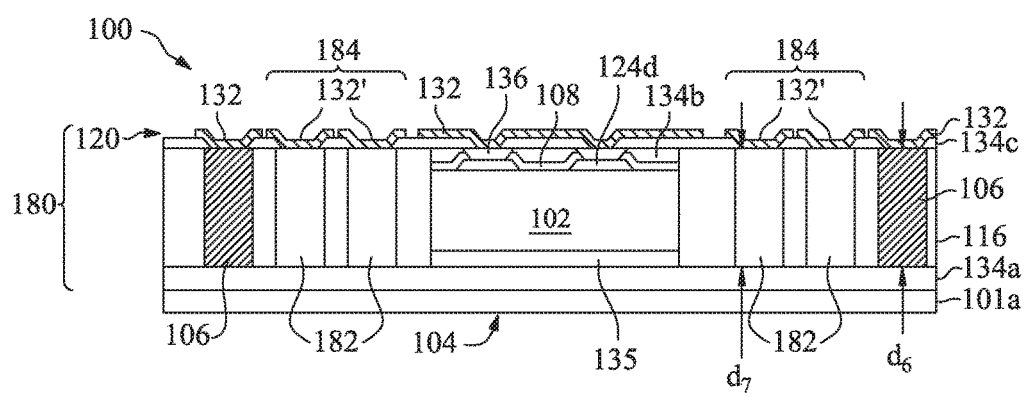

FIGS. 18 and 19 are cross-sectional views illustrating a method of packaging a semiconductor device at various stages of a packaging process in accordance with some embodiments. In FIG. 18, a packaging process after the steps shown in FIGS. 6 and 7 is shown. A carrier 101a includes an insulating material 134a formed thereon in some embodiments. The insulating material 134a may be formed using a spin-on process, CVD, or other deposition process, before the packaging process. Note that the carrier 101a shown in FIG. 6 may also include the insulating material 134a formed thereon. The insulating material 134a may comprise PBO or other types of insulating material, for example. In some embodiments, the insulating material 134a is not included.

A plurality of through-vias 106 is formed over the carrier 101a (i.e., over the insulating material 134a disposed on the carrier 101a) using a process described for the through-vias 106 shown in FIG. 6. A plurality of dummy through-vias 182 is also formed over the carrier 101a in dummy through-via regions 184, as shown in FIG. 18. In some embodiments, the dummy through-vias 182 and the electrically functional through-vias 106 are formed simultaneously in the same processing step. The dummy through-vias 182 are advantageously formed in the same material layer that the through-vias 106 of the packaged semiconductor device 100 are formed in, in some embodiments. Thus, no additional processing steps or materials are required to include the dummy through-vias 182 in the package. Existing lithography masks and packaging processes for the through-vias 106 may advantageously be modified to include the dummy through-vias 182 in the packaged semiconductor device 100. Because the dummy through-vias 182 are formed in the same material layer that electrically functional through-vias 106 are formed in some embodiments, the dummy through-vias 182 comprise the same material as the electrically functional through-vias 106 in some embodiments. In other embodiments, the dummy through-vias 182 may be formed in a separate processing step.

In some embodiments, the dummy through-vias 182 and the electrically functional through-vias 106 are formed simultaneously using a plating process. In other embodiments, the dummy through-vias 182 and the electrically functional through-vias 106 are formed simultaneously using a single patterning process, as examples. The dummy through-vias 182 and the electrically functional through-vias 106 may also be formed using other methods.

One or more integrated circuit dies 102 are coupled to the carrier 101a by a DAF 135 or other adhesive, also shown in FIG. 18 and as described for FIG. 7. The integrated circuit die 102 may include conductive pillars 136 comprising a metal such as Cu coupled to contact pads 124d, and an insulating material 134b disposed over the conductive pillars 136 and passivation material 108 in some embodiments. The through-vias 106 and dummy through-vias 182 may be formed over the carrier 101a before or after the integrated circuit die or dies 102 are coupled to the carrier 101a. A portion of the insulating material 134b may extend over top surfaces of the conductive pillars 136 in some embodiments.

A material 116 described previously herein is formed over and around the plurality of through-vias 106, the plurality of dummy through-vias 182, and the integrated circuit die(s) 102, as shown in FIG. 19 and as described for FIG. 8. The material 116 is planarized, removing the material 116 from top surfaces of the integrated circuit dies 102. A top portion of the insulating material 134b is removed in some embodiments, to at least expose top surfaces of the conductive pillars 136 so that electrical connections may be made to the integrated circuit die 102. A top portion of the conductive pillars 136 and a top portion of the through-vias 106 and dummy through-vias 182 may also be removed in the planarization process of the material 116, reducing their height, as illustrated in FIG. 19.

The resulting height of the through-vias 106 after the planarization process of the material 116 comprises a dimension $d_6$, wherein dimension $d_6$ comprises about 80 µm to about 310 µm in some embodiments. Dimension $d_6$ may also comprise other values. The height of the through-vias 106 comprising dimension $d_6$ is also referred to herein as a first height. The resulting height of the dummy through-vias 182 comprises a dimension $d_7$, wherein dimension $d_7$ is substantially the same as dimension $d_6$ in some embodiments. Dimension $d_7$ is also referred to herein as a second height, wherein the second height of the dummy through-vias 182 is substantially the same as the first height of the through-vias 106, in some embodiments.

The top surfaces of the material 116, through-vias 106, dummy through-vias 182, and conductive pillars 136 and insulating material 134b of the integrated circuit die 102 are substantially coplanar after the planarization process of the material 116, as illustrated in FIG. 19. Including the dummy through-vias 182 in the packaging device 180 and the packaged semiconductor device 100 improves the planarization process by improving uniformity of the through-via 106 height and critical dimension (CD).

An interconnect structure 120 is then formed over the top surfaces of the material 116, through-vias 106, dummy through-vias 182, and the integrated circuit die 102. In some embodiments, to form the interconnect structure 120, an insulating material 134c comprising a similar material and deposition process as insulating material 134a is formed over the top surfaces of the material 116, through-vias 106, dummy through-vias 182, and integrated circuit die 102. The insulating material 134c is patterned using a lithography process, laser, or other methods to form openings in the insulating material 134c and expose top surfaces of the through-vias 106 and conductive pillars 136 so that electrical connections may be made to the through-vias 106 and conductive pillars 136. In some embodiments, openings are also formed over the dummy through-vias 182, as shown in FIG. 19.

A conductive material comprising a metal such as Cu, a Cu alloy, or other materials is formed over the patterned insulating material 134c, and the conductive material is patterned using lithography to form UBM structures 132 disposed over and electrically connected to the through-vias 132 and the conductive pillars 136 of the integrated circuit die 120, also shown in FIG. 19. In some embodiments, UBM structures 132' are also formed over the dummy through-vias 182. The UBM structures 132' comprise dummy UBM structures 132' that are disposed over the dummy through-vias 182 but are not electrically coupled to a conductive component of the packaged semiconductor device 100 other than to the dummy through-vias 182. The dummy UBM structures 132' comprise UBM caps for the dummy through-vias 182, for example. Note that the interconnect structure 120 may include other material layers, such as the material layers described for interconnect structure 120a shown in FIG. 1. For example, the interconnect structure 120 may include conductive lines and vias formed in one or more insulating material layers, disposed under the insulating material 134c and UBM structures 132 and 132'.

After the formation of the interconnect structure 120, in some embodiments, the packaging of the semiconductor device is complete, and the carrier 101a is removed. In other embodiments, the carrier 101a comprises a first carrier 101a, and the interconnect structure 120 comprises a first interconnect structure 120 that is formed on a first side of the packaged semiconductor device 100. A second carrier (see second carrier 101a shown in FIG. 10) is coupled to the first interconnect structure (see first interconnect structure 120a shown in FIG. 10), and the first carrier 101a is removed (see also FIG. 10). A second interconnect structure (see second interconnect structure 120b shown in FIG. 11) is formed over a second side of the packaged semiconductor device 100, wherein the second side of the packaged semiconductor device 100 is opposite the first side of the packaged semiconductor device 100. The second carrier 100b is then removed. Likewise, the dummy through-vias 182 described herein may be implemented in embodiments wherein the material 116 comprises an interposer substrate material, as shown in and described with reference to FIG. 12. The dummy through-vias 182 are formed in the material 116 proximate the through-vias 106, as described herein.

The through-vias 106 are electrically functional and provide vertical electrical connections for the packaging device 180 and packaged semiconductor device 100. The dummy through-vias 182 and dummy UBM structures 132' are electrically non-functional and are not coupled to other conductive components of the packaged semiconductor device 100 that are electrically functional in some embodiments. In some embodiments, the dummy through-vias 182 do not change electrical connection properties of a packaging device 180 or a packaged semiconductor device 100 in some embodiments, for example.

Figure 20:
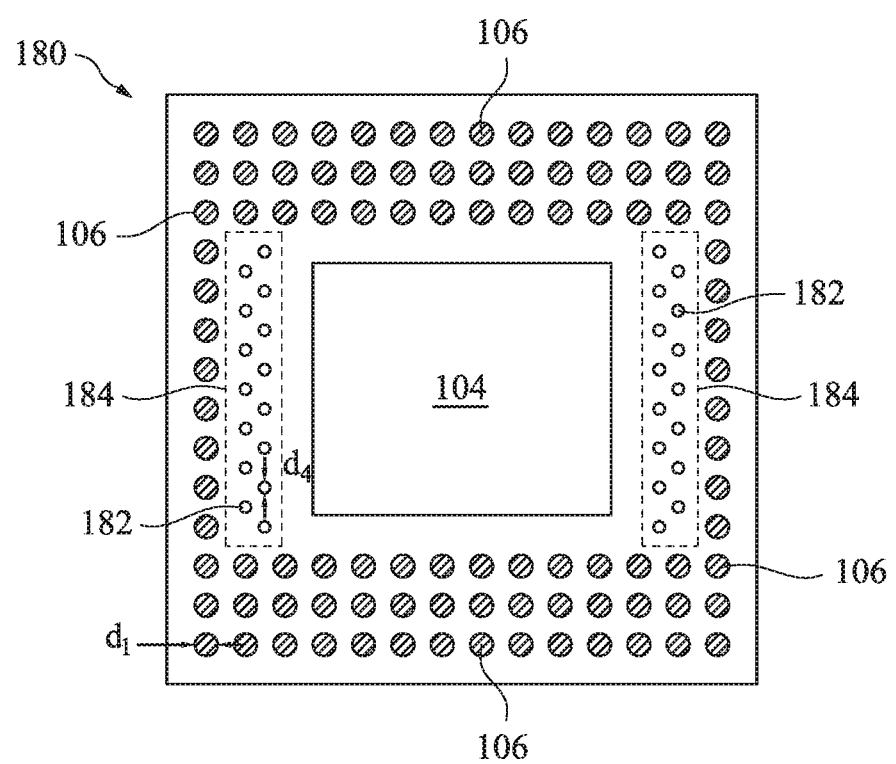
FIG. 20 is a top view showing a packaging device for semiconductor devices in accordance with some embodiments, wherein the dummy through-vias are smaller than the electrically functional through-vias.

FIG. 20 is a top view of a packaging device 180 for semiconductor devices in accordance with some embodiments, wherein the dummy through-vias 182 are smaller than the electrically functional through-vias 106. The dummy through-vias 182 are formed in dummy through-via regions 184 proximate isolated through-vias 106. The through-vias 106 comprise a width or diameter in some embodiments comprising dimension $d_1$, which is also referred to herein as a first width. The dummy through-vias 182 comprise a width or diameter in some embodiments comprising dimension $d_4$, wherein dimension $d_4$ is less than the first width. The width or diameter of the dummy through-vias 182 comprising dimension $d_4$ is also referred to herein as a second width, wherein the second width is less than the first width of the through-vias 106 in some embodiments, for example. Exemplary values for dimension $d_4$ are described herein with reference to FIG. 15.

In the embodiments shown in FIG. 20, the plurality of dummy through-vias 182 having a smaller second width than the first width of the through-vias 106 is included in the dummy through-via regions 184 and is arranged in a shape of an array of staggered rows and columns, or one or more staggered lines. For example, in FIG. 20, embodiments are illustrated wherein the dummy through-vias 182 comprise a shape of an array comprising two staggered columns, or two staggered lines. In other embodiments, the plurality of dummy through-vias 182 having a smaller second width than the first width of the through-vias 106 may be arranged in one or more substantially straight lines or an array of substantially straight rows and columns (not shown in the drawings), similar to the embodiments shown in FIG. 16.

FIGS. 21A, 21B, and 22 are cross-sectional views illustrating a method of packaging a semiconductor device at various stages of a packaging process in accordance with some embodiments. The packaging process flow is similar to the process flow described for FIGS. 18 and 19. However, the dummy through-vias 182 have a smaller width (as shown in FIG. 15 and FIG. 20) and height than the electrically functional through-vias 106. In some embodiments, the dummy through-vias 182 and the through-vias 106 are formed simultaneously using a plating process. A seed layer (not shown) is deposited over the insulating material 134a, and a sacrificial material is formed over the seed layer. The sacrificial material is patterned to form openings 105 using lithography for the desired widths comprising dimension $d_1$ of the through-vias 106 and dimension $d_4$ of the dummy through-vias 182, as illustrated in FIG. 21A. Then a plating process is used to plate the remainder of the material of the through-vias 106 and the dummy through-vias 182 through the patterned sacrificial material 140. Because the second width comprising dimension $d_4$ of the dummy through-vias 182 is less than the first width comprising dimension $d_1$ of the through-vias 106, due to a current crowding effect during the plating process, a height comprising dimension $d_8$ of the dummy through-vias 182 is less than a height of the through-vias 106 after the plating process, as illustrated in FIG. 21B. The height of the dummy through-vias 182 comprising dimension $d_8$ comprises about 45 p.m to about 80 p.m in some embodiments. Dimension $d_8$ may also comprise other values. The height of the dummy through-vias 182 comprising dimension $d_8$ is also referred to herein as a second height.

Referring next to FIG. 22, the patterned sacrificial material 140 used for the plating process has been removed, and the material 116 is formed over and around the plurality of through-vias 106, the plurality of dummy through-vias 182, and the integrated circuit die 102, as described for FIG. 19 and FIG. 8. The material 116 is planarized, removing the material 116 from top surfaces of the integrated circuit dies 102. A top portion of the through-vias 106 may also be reduced in the planarization process of the material 116, reducing their height, as illustrated in FIG. 22. The resulting height of the through-vias 106 after the planarization process of the material 116 comprises a dimension $d_6$, as described for the embodiments shown in FIG. 19. The height of the dummy through-vias 182 comprising dimension $d_8$ is unchanged during the planarization process, because a top surface of the dummy through-vias 182 resides below a top surface of the material 116 during and after the planarization process, for example. The resulting height of the through-vias 106 comprises a dimension $d_6$, wherein dimension $d_6$ is greater than dimension $d_8$ in some embodiments. Thus, the second height of the dummy through-vias 182 comprising dimension $d_8$ is less than the first height of the through-vias 106 comprising dimension $d_6$ in some embodiments.

The top surfaces of the material 116, through-vias 106, and conductive pillars 136 and insulating material 134b of the integrated circuit die 102 are substantially coplanar after the planarization process of the material 116, as illustrated in FIG. 22. Including the dummy through-vias 182 in the packaging device 180 and the packaged semiconductor device 100 improves the planarization process by improving uniformity of the through-via 106 height and CD. An interconnect structure 120 is then formed over the top surfaces of the material 116, through-vias 106, and the integrated circuit die 102, as shown in FIG. 22, wherein the interconnect structure 120 comprises similar materials, components, and processing steps as described for FIG. 19.

In the embodiments shown in FIGS. 21B and 22, the through-vias 106 and the dummy through-vias 182 may also be formed using a multiple patterning process, such as a double patterning process. A conductive material may be formed over the insulating material 134a, and the conductive material may be patterned using two lithography steps, one for the through-vias 106 and another one for the dummy through-vias 182. Etch parameters of the dummy through-vias 182 may be adjusted or controlled to reduce the height of the dummy through-vias 182 by a predetermined amount during the etch process, for example. In accordance with some double patterning schemes, alternating patterns may be patterned using a first resist, first exposure, and etch step to form first through-vias 106 and/or dummy through-vias 182; removing the first resist; and using a second resist, second exposure, and second etch step to form second through-vias 106 and/or dummy through-vias 182 between the first-formed through-vias 106 and/or dummy through-vias 182 in some embodiments, for example. The through-vias 106 and dummy through-vias 182 comprising different widths and heights may also be formed using other methods.

The arrangements, shapes, and locations of the dummy through-vias 182 illustrated in the drawings of the present disclosure are merely examples. The dummy through-vias 182 may also be located in other regions of a packaging device 180 or packaged semiconductor device 100, and the dummy through-vias 182 may be arranged in other patterns and shapes. In some embodiments, one or more dummy through-vias 182 is disposed proximate an isolated one of the plurality of through-vias 106, or one or more dummy through-vias 182 is disposed proximate an isolated group of the plurality of through-vias 106, as examples.

Each of the dummy through-vias 182 is spaced apart by a predetermined distance from electrically functional through-vias 106 in some embodiments. The dummy through-vias 182 are spaced apart from through-vias 106 by about a width of a through-via 106 or a dummy through-via 182 or greater, as an example. The dummy through-vias 182 may also comprise other spacing dimensions and relative width dimensions with respect to the electrically functional through-vias 106.

The dimensions $d_4$, $d_5$, $d_7$, and $d_8$ described herein of the dummy through-vias 182 are selected to be of a sufficient, adequate, and effective size or value to improve the planarization process of the material 116 and improve the CD and height uniformity of the through-vias 106, for through-vias 106 comprising the dimensions $d_1$ and $d_5$ described herein, in order to achieve a yield improvement for the packaging devices 180 and packaged semiconductor devices 100, in accordance with some embodiments.

Figure 23:
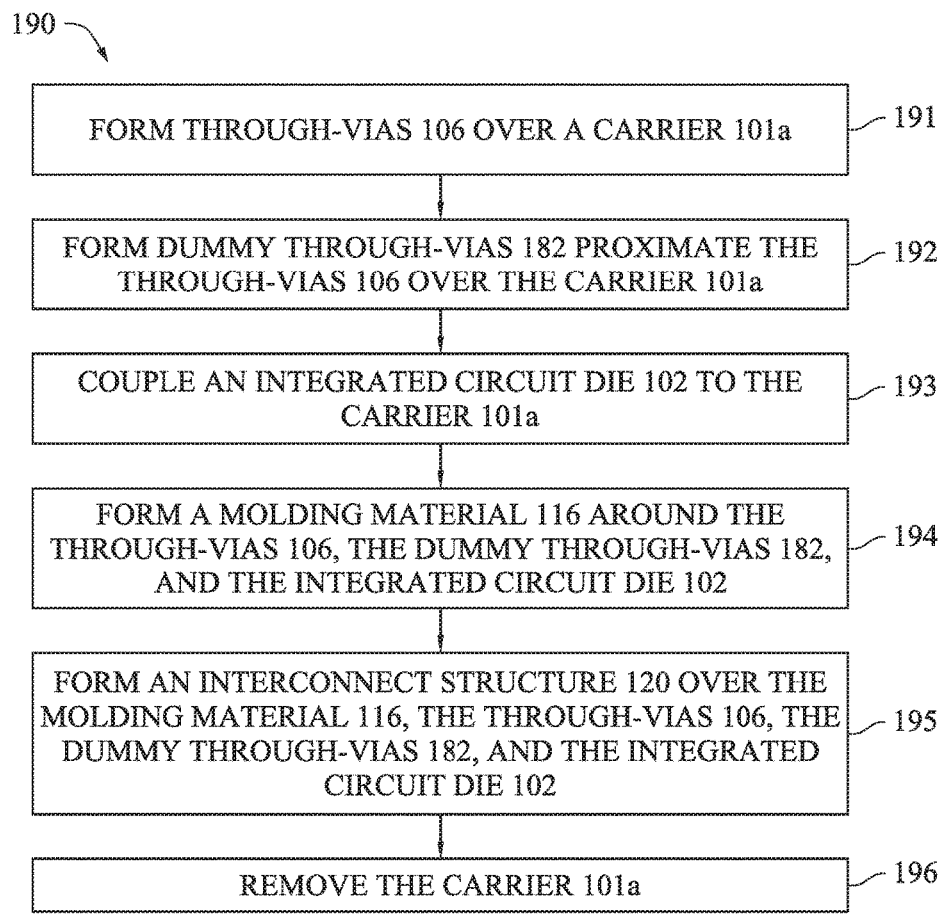
FIG. 23 is a flow chart of a method of packaging semiconductor devices in accordance with some embodiments, wherein the dummy through-vias are included in the packages.

FIG. 23 is a flow chart 190 of a method of packaging semiconductor devices in accordance with some embodiments. In step 191, through-vias 180 are formed over a carrier 101a (see also FIG. 18). In step 192, dummy through-vias 182 are formed proximate the through-vias 106 over the carrier 101a. (FIG. 18). In step 193, an integrated circuit die 102 is coupled to the carrier 101a (FIG. 18). In step 194, a molding material 116 is formed around the through-vias 106, the dummy through-vias 182, and the integrated circuit die 102 (FIG. 19). In step 195, an interconnect structure 120 is formed over the molding material 116, the through-vias 106, the dummy through-vias 182, and the integrated circuit die 102 (FIG. 19). In step 196, the carrier 101a is removed (see also FIG. 10).

The dummy through-vias 182 described herein may implemented in PoP packages 170, as shown in FIG. 13. A packaged semiconductor device 100 including the dummy through-vias 182 may be coupled to another packaged semiconductor device 150 to form a PoP device 170. For example, a packaged integrated circuit such as the packaged semiconductor device 150 shown in FIG. 13 may be coupled to the interconnect structure 120 of the packaged semiconductor devices 100 shown in FIG. 19 or FIG. 22 by a plurality of connectors 158. The connectors 158 may be coupled to the UBM structures 132 of the interconnect structures 120, for example. The PoP device 170 may further be coupled to a substrate (not shown) to form a chip-on-wafer-on-substrate (CoWoS) device, in some embodiments.

In the embodiments shown in FIGS. 15, 16, 17, and 20, the dummy through-via regions 184 that include the dummy through-vias 182 are shown that have a shape of a rectangle. The dummy through-via regions 184 may also comprise other shapes, such as T-shaped, L-shaped, meandering patterns, or irregular shapes, or combinations of square, rectangular and/or other shapes in a top view. The dummy through-via regions 184 that include the dummy through-vias 182 may also comprise other shapes. A single dummy through-via 182 may also be disposed within a dummy through-via region 184, as another example. For example, in the cross-sectional views shown in FIG. 19 or 21B, one of the dummy through-vias 182 may not be included in the dummy through-via regions 184, and a single dummy through-via 182 may be included in the dummy through-via regions 184 rather than a substantially straight or staggered line, row, or column of the dummy through vias 182.

The embodiments of the present disclosure described with reference to FIGS. 14 through 23 may be used in combination with or implemented in the embodiments described with reference to FIG. 1 through 13 in some embodiments. For example, forming the interconnect structure 120 shown in FIGS. 19 and 22 may comprise forming an interconnect structure comprising a through-via region disposed over one of the plurality of through-vias 106. A dummy conductive feature 114 may be formed in the through-via region of the interconnect structure 120 in a conductive feature layer of the interconnect structure 120, as described in the embodiments shown in FIGS. 1 through 13. In other embodiments, the dummy conductive features 114 are not included in the interconnect structures 120.

Some embodiments of the present disclosure include packages 180 for semiconductor devices, and methods of packaging semiconductor devices. Other embodiments include packaged semiconductor devices 100 and 100' that have been packaged using the packaging methods described herein.

Some advantages of embodiments of the present disclosure include providing packaging structures and methods wherein dummy features are fabricated in interconnect structures of a package proximate through-via regions of the interconnect structures. The dummy features advantageously provide heat dissipation during various processing steps of the packaged semiconductor device, and also during device operation. The dummy features dissipate any heat generated within or outside of the packages, which could cause package deformation, connector (e.g., solder ball) deformation, or other issues.

No additional packaging process steps, lithography masks, lithography processes, or costs are required to include the dummy features in semiconductor device packages. A design rule for dummy pattern inclusion into conductive feature layers of interconnect structures in through-via regions can be defined, and the dummy feature patterns can be generated on lithography masks used for the formation and patterning of conductive feature layers, in order to provide heat dissipation in the through-via regions, for example.

The dummy features can be included in low density areas of interconnects for improved heat dissipation. Forming the dummy features in through-via regions proximate the through-vias is advantageous because the through-vias can transfer heat within the package, for example. The dummy features are adapted to dissipate heat transferred by the through-vias, which is particularly advantageous in areas of interconnect structures that have a low density of conductive features. Furthermore, the dummy conductive features and packaging methods and structures described herein are easily implementable in manufacturing and packaging process flows.

The embodiments illustrated in FIGS. 14 through 23 provide advantages of uniformity improvement for through-vias of packaging devices and packaged semiconductor devices. Through-via CD uniformity and height uniformity are improved by including the dummy through-vias in the package. The CD and height uniformity result in improved yields due to fewer disconnections of through-vias or over-grinding of the through-vias and/or integrated circuit dies.

The dummy through-vias are included in the package in and/or around isolated areas that are absent the through-vias in some embodiments, which balances the pattern density of the through-vias. The dummy through-vias may be the same size or smaller than electrically functional through-vias within a package, and the dummy through-vias may be arranged into rows or columns in an array, in a single line or multiple lines, in straight or staggered patterns, or other permutations of arrangements. In some embodiments wherein the dummy through-vias are substantially the same height as the functional through-vias, an RDL cap or UBM structure may be included over a top surface of the dummy through-vias, which reduces or prevents cracking of a surrounding insulating material.

The dummy through-vias are embedded into existing through-via material layers of packaging devices and do not require additional processing steps or material layers. The dummy through-vias may be formed simultaneously with the formation of functional through-vias of the package. No routing penalty is required to implement the dummy through-vias in a packaged semiconductor device.

Furthermore, including dummy UBM structures over the dummy through-vias in some embodiments wherein the dummy through-vias comprise substantially the same height as the through-vias provides an ability to form dummy connectors such as conductive bumps on the dummy UBM structures, which improves bump height uniformity of the packaged semiconductor device 100, and also permits a shorter plating height for the UBM structures and a smaller conductive bump diameter.

In some embodiments, a package for a semiconductor device includes a plurality of through-vias, an integrated circuit die mounting region, and a material disposed around and between the plurality of through-vias and the integrated circuit die mounting region. An interconnect structure is disposed over the material, the plurality of through-vias, and the integrated circuit die mounting region. The interconnect structure comprises a dummy feature disposed proximate one of the plurality of through-vias.

In some embodiments, a device includes a molding material, a plurality of through-vias disposed within the molding material, and an integrated circuit die disposed within the molding material. An interconnect structure is disposed over the molding material, the plurality of through-vias, and the integrated circuit die. The interconnect structure comprises a conductive feature layer and a through-via region proximate one of the plurality of through-vias. The through-via region includes a dummy conductive feature disposed in the conductive feature layer.

In other embodiments, a method of packaging a semiconductor device includes forming a plurality of through-vias over a carrier, coupling an integrated circuit die to the carrier, and forming a molding material around the plurality of through-vias and the integrated circuit die. The method includes forming an interconnect structure over the molding material, the plurality of through-vias, and the integrated circuit die. The interconnect structure includes a through-via region disposed over one of the plurality of through-vias. A dummy conductive feature is formed in the through-via region of the interconnect structure in a conductive feature layer of the interconnect structure. The carrier is removed.

In some embodiments, a device includes a molding material, a plurality of through-vias disposed within the molding material, and a dummy through-via disposed within the molding material. An integrated circuit die is disposed within the molding material. An interconnect structure is disposed over the molding material, the plurality of through-vias, the dummy through-via, and the integrated circuit die.

In other embodiments, a packaging device includes an integrated circuit die mounting region, a plurality of through-vias disposed proximate the integrated circuit die mounting region, and a plurality of dummy through-vias disposed proximate the plurality of through-vias. A material is disposed around and between the plurality of through-vias, the plurality of dummy through-vias, and the integrated circuit die mounting region. An interconnect structure is disposed over the material, the plurality of through-vias, the plurality of dummy through-vias, and the integrated circuit die mounting region.

In yet other embodiments, a method of packaging a semiconductor device includes forming a plurality of through-vias over a carrier, and forming a plurality of dummy through-vias proximate the plurality of through-vias over the carrier. The method includes coupling an integrated circuit die to the carrier, and forming a molding material around the plurality of through-vias, the plurality of dummy through-vias, and the integrated circuit die. An interconnect structure is formed over the molding material, the plurality of through-vias, the plurality of dummy through-vias, and the integrated circuit die. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:

forming a conductive element over a carrier;
simultaneously with the forming the conductive element, forming a dummy conductive element proximate the conductive element over the carrier, the dummy conductive element and the conductive element having bottom surfaces at the same level with respect to the carrier, the bottom surfaces being most proximate to the carrier, the forming the conductive element and the dummy conductive element comprising a plating process using the same material, the forming the conductive element and the dummy conductive element comprising beginning the plating process at the same beginning time and finishing the plating process at the same finishing time, wherein at the same finishing time the dummy conductive element has a different height than the conductive element;
coupling an integrated circuit die to the carrier;
after the forming the conductive element and the forming the dummy conductive element, forming a molding material around the conductive element, the dummy conductive element, and the integrated circuit die;
forming an interconnect structure over the molding material, the conductive element, the dummy conductive element, and the integrated circuit die, the forming the interconnect structure comprising:
    forming a first interconnect structure over a first side of a packaged semiconductor device comprising the conductive element, the first interconnect structure comprising a first conductive feature layer and a second conductive feature layer, in a top-down view, the first interconnect structure comprising a conductive line in a through-via region disposed over the conductive element;
    in the top-down view, determining a density of the conductive line in the through-via region of the first conductive feature layer;
    in the top-down view, forming a dummy conductive feature in the through-via region of the second conductive feature layer when the density of the conductive line in the through-via region is less than 50%; and
removing the carrier.

2. The method according to claim 1, wherein forming the interconnect structure comprises forming a redistribution layer (RDL) or a post-passivation interconnect (PPI) structure.

3. The method according to claim 1, wherein forming the interconnect structure comprises forming an interconnect structure comprising a through-via region disposed over the conductive element, and wherein the method further comprises forming a dummy conductive feature in the through-via region of the interconnect structure in a conductive feature layer of the interconnect structure.

4. The method according to claim 1, wherein the carrier comprises a first carrier;
wherein the method further comprises:
first, coupling a second carrier to the first interconnect structure;
second, removing the first carrier;
third, forming a second interconnect structure over a second side of the packaged semiconductor device, wherein the second side of the packaged semiconductor device is opposite the first side of the packaged semiconductor device; and
fourth, removing the second carrier.

5. The method of claim 4,
further comprising:

forming an insulating layer over the carrier; and
forming an adhesive layer over the insulating layer, lateral edges of the integrated circuit die being level with lateral edges of the adhesive layer, the insulating layer being directly interposed between the adhesive layer and the carrier.

6. The method of claim 1, wherein a volume of the dummy conductive element is less than a volume of the conductive element.

7. The method of claim 1 further comprising:
forming a sacrificial layer over the carrier;
patterning the sacrificial layer to form openings; and
after the forming the conductive element and the forming the dummy conductive element, removing the sacrificial layer.

8. The method of claim 7 further comprising before forming the sacrificial layer, forming a seed layer over the carrier.

9. A method of processing a semiconductor device, the method comprising:
forming a sacrificial layer over a carrier;
forming first openings and a second opening in the sacrificial layer, the first openings and the second opening extending entirely through the sacrificial layer;
forming a plurality of conductive elements in the first openings, each of the plurality of conductive elements having a first height;
forming a dummy conductive element in the second opening over the carrier and proximate the plurality of conductive elements simultaneously with forming the plurality of conductive elements, forming the plurality of conductive elements and the dummy conductive element by a plating process starting at a location equally proximate to the carrier and finishing at different locations distal from the carrier, the forming an entirety of the plurality of conductive elements and the forming an entirety of the dummy conductive element have the same starting time and the same ending time, wherein at the same ending time the plurality of conductive elements are at the first height, the plurality of conductive elements and the dummy conductive element comprising the same material, the dummy conductive element having a second height, the second height being less than the first height;
attaching an integrated circuit die to the carrier and proximate to one or both of the plurality of conductive elements and dummy conductive element, the integrated circuit die having a backside proximate the carrier and an active side distal from the carrier;
forming a material around and between the plurality of conductive elements, the dummy conductive element, and the integrated circuit die;
forming an interconnect structure over the material, the plurality of conductive elements, the dummy conductive element, and the integrated circuit die, forming the interconnect structure comprising:
forming an interconnect structure comprising one or more conductive lines in a plurality of through-via regions in a first conductive feature layer disposed over the plurality of conductive elements, each through-via region corresponding to one conductive element, the interconnect structure further comprising a second conductive feature layer disposed over the first conductive feature layer, in a top-down view, a density of the conductive lines in each of two through-via regions of the plurality of through-via regions being less than 50%; and
in the top-down view, forming a dummy conductive feature in the second conductive feature layer, the dummy conductive feature being in both of the two through-via regions and connecting both of the two through-via regions.

10. The method of claim 9, further comprising forming a plurality of conductive features electrically coupled to the plurality of conductive elements and the integrated circuit die.

11. The method of claim 9, wherein the integrated circuit die is disposed within the material, and wherein the material comprises a molding material or an underfill material.

12. The method of claim 9, wherein the dummy conductive element is disposed in a dummy through-via region, and wherein the dummy through-via region is disposed between the integrated circuit die and one of the plurality of conductive elements.

13. The method of claim 9, wherein the dummy conductive element is disposed proximate an isolated one of the plurality of conductive elements or proximate an isolated group of the plurality of conductive elements.

14. The method of claim 9,
further comprising:
forming an insulating layer over the carrier; and
forming an adhesive layer over the insulating layer, lateral edges of the integrated circuit die being level with lateral edges of the adhesive layer, the insulating layer being directly interposed between the adhesive layer and the carrier.

15. A method of forming a packaged semiconductor device, the method comprising:
forming an insulating material over a substrate;
forming a seed layer over the insulating material;
forming a sacrificial material over the seed layer;
patterning the sacrificial material to form first openings and second openings in the sacrificial material, the patterning exposing a top surface of the seed layer through the first openings and the second openings;
forming a plurality of conductive elements in the first openings over the insulating material;
forming a plurality of dummy conductive elements in the second openings over the insulating material simultaneously with the forming the plurality of conductive elements, the forming the plurality of dummy conductive elements and the plurality of conductive elements comprising simultaneously starting a plating through the sacrificial material from a starting point at an equal distance from the insulating material and simultaneously ending the plating through the sacrificial material, wherein at the simultaneously ending the plating a most distal surface of the plurality of conductive elements from the insulating material is at a differing distance from a most distal surface of the plurality of dummy conductive elements from the insulating material, the plurality of dummy conductive elements and the plurality of conductive elements contacting the seed layer, the simultaneously starting and ending the plating resulting in each of the plurality of dummy conductive elements having a height less than each of the plurality of conductive elements;
forming an adhesive layer over the insulating material;
attaching an integrated circuit die over the adhesive layer;
forming a molding material over the substrate and between the plurality of conductive elements, the plurality of dummy conductive elements, and the integrated circuit die: and forming an interconnect structure over the molding material, the plurality of conductive elements, the plurality of dummy conductive elements, and the integrated circuit die, forming the interconnect structure comprising:

forming an interconnect structure over the molding material, the plurality of conductive elements, the plurality of dummy conductive elements, and the integrated circuit die, the interconnect structure comprising a first conductive feature layer over the plurality of conductive elements and a second conductive feature layer over the first conductive feature layer, the first conductive feature layer comprising conductive lines, in a top-down view the interconnect structure further comprising through-via regions, each of the through-via regions corresponding to one of the plurality of conductive elements; and forming a dummy conductive feature in a plurality of the through-via regions in the second conductive feature layer when a density of the conductive lines in the plurality of the through-via regions in the first conductive feature layer is less than 50%, the dummy conductive feature connecting the plurality of the through-via regions.

16. The method of claim 15, wherein a volume of each of the plurality of dummy conductive elements being less than a volume of each of the plurality of conductive elements.

17. The method of claim 15, wherein each of the plurality of dummy conductive elements is spaced apart by a predetermined distance from the plurality of conductive elements.

18. The method of claim 15, wherein the plurality of dummy conductive elements is arranged in a shape selected from the group consisting essentially of: a substantially straight line, a staggered line, an array of substantially straight rows and columns, an array of staggered rows and columns, and combinations thereof.

19. The method of claim 15, wherein the interconnect structure comprises an under-ball metallization (UBM) structure disposed over the plurality of conductive elements and the integrated circuit die.

20. The method of claim 15, further comprising attaching a packaged integrated circuit coupled to the interconnect structure.

21. The method of claim 20,
  further comprising:
    forming an insulating layer over the substrate, the insulating layer being directly interposed between the adhesive layer and the substrate, lateral edges of the integrated circuit die being level with lateral edges of the adhesive layer.

* * * * *